United States Patent
Tanaka

(10) Patent No.: US 7,478,953 B2
(45) Date of Patent: Jan. 20, 2009

(54) ELECTRICAL CONNECTION BETWEEN BIDIRECTIONAL OPTICAL SUBASSEMBLY AND CIRCUIT BOARD IN OPTICAL TRANSCEIVER

(75) Inventor: Yasuhiro Tanaka, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/727,903

(22) Filed: Mar. 28, 2007

(65) Prior Publication Data

US 2008/0031574 A1   Feb. 7, 2008

(30) Foreign Application Priority Data

Apr. 14, 2006  (JP) .............. 2006-112108

(51) Int. Cl.
*G02B 6/36*   (2006.01)

(52) U.S. Cl. .............. 385/89; 385/88; 398/139; 398/156; 439/67; 439/77

(58) Field of Classification Search ............. 385/88–90, 385/92; 398/135, 139, 156; 439/67, 77
See application file for complete search history.

(56) References Cited

U.S. PATENT DOCUMENTS

| | | | | |
|---|---|---|---|---|
| 6,783,284 B2 | | 8/2004 | Althaus et al. ............. | 385/92 |
| 6,817,782 B2 | * | 11/2004 | Togami et al. ............. | 385/92 |
| 7,153,043 B1 | * | 12/2006 | Zhang et al. .............. | 385/92 |
| 7,267,553 B2 | * | 9/2007 | Sone ........................ | 439/67 |
| 7,367,717 B2 | * | 5/2008 | Yu et al. ................... | 385/90 |
| 2003/0142929 A1 | * | 7/2003 | Bartur et al. .............. | 385/92 |
| 2005/0259994 A1 | * | 11/2005 | Zhang et al. ............. | 398/164 |
| 2007/0230878 A1 | | 10/2007 | Nakazawa et al. ......... | 385/92 |

FOREIGN PATENT DOCUMENTS

| | | | |
|---|---|---|---|
| JP | 02-239212 A | | 9/1990 |
| JP | 08-136767 A | | 5/1996 |
| JP | 2004-012835 | | 1/2004 |
| JP | 2005-099482 A | | 4/2005 |
| JP | 2005-301005 A | | 10/2005 |
| JP | 2006-005347 A | | 1/2006 |
| JP | 2007048822 A | * | 2/2007 |

\* cited by examiner

*Primary Examiner*—Sung Pak
*Assistant Examiner*—Daniel Petkovsek
(74) *Attorney, Agent, or Firm*—Venable LLP; Michael A. Sartori; Justine A. Gozzi

(57) ABSTRACT

The present invention is to provide an optical transceiver that installs a bi-directional optical sub-assembly. The bi-directional sub-assembly is installed within the transceiver and fixed by the holder with a pair of legs put the sub-assembly therebetween. By press-fitting these legs into respective pockets provided in the side of the transceiver, the sub-assembly is to be fixed with the housing. To press-fit the holder completes the fixing and the positioning of the sub-assembly at the same time.

10 Claims, 23 Drawing Sheets

US 7,478,953 B2

ELECTRICAL CONNECTION BETWEEN BIDIRECTIONAL OPTICAL SUBASSEMBLY AND CIRCUIT BOARD IN OPTICAL TRANSCEIVER

BACKGROUND OF THE INVENTION

1. Field of the Invention

The present invention relates to an optical transceiver, in particular, the invention relates to a bi-directional transceiver in which a sole fiber may perform an optical transmission and an optical reception with different signal wavelength.

2. Related Prior Art

A bi-directional optical assembly has been well known, where the optical transmission and the optical reception with different signal wavelengths each other are carried out to the sole fiber. To set the former wavelength to be 1.3 µm, while, the latter wavelength to be 1.55 µm enables the bi-directional communication with the sole fiber. For example, a Japanese Patent Application published as JP-2004-012835A has disclosed a bi-direction optical assembly that includes a boxed shaped body. One side of the body arranges an optical sleeve, another side opposite to it installs an optical transmitting assembly, and the last side connecting those two sides arranges an optical receiving assembly. A United States patent, the U.S. Pat. No. 6,783,284, has disclosed a bi-direction assembly similar to that disclosed in the Japanese Patent application.

Recently, one type of optical transceivers, which is called as the SFP (Small Form-factor Pluggable) transceiver, has been widely spread because such transceivers follow the multi-source agreement (MSA) in electrical specifications and outer dimensions. The MSA of the SFP transceiver only defines, which is called, a full-duplex configuration which is based on two optical fibers, one for the optical transmission and the other for the optical reception. A type of the transceiver that follows one of industry standards and installs the bi-directional assembly therein is not known yet.

The present invention is to provide an optical transceiver that installs a bi-directional optical assembly.

SUMMARY OF THE INVENTION

An aspect of the present invention relates to an electrically connecting arrangement of a bi-directional optical subassembly with a circuit board. Because the bi-directional optical subassembly includes two optical subassemblies, one of which is for the optical transmission and the other of which is for the optical reception, these subassemblies are necessary to be arranged in the optical transceiver such that an optical axis of one of the subassemblies is substantially in perpendicular to an optical axis of the other of the subassemblies, and a flexible printed circuit board performs the electrical connection between at least one of the subassembly, whose optical axis is in perpendicular to a longitudinal axis of the transceiver, and the circuit board.

According to an embodiment of the present invention, the flexible printed circuit board is configured; (1) to extend from an edge of the circuit board to a direction substantially in parallel to the optical axis of one of the subassembly, (2) to be bent to a direction substantially in perpendicular to the circuit board to form a vertical portion, (3) to extend from a side of the vertical portion to a direction substantially in parallel to the optical axis of the other of the subassembly to form a connecting portion, and (4) to be bent, in an end of the connecting portion, in a U-shaped cross section so as to be substantially in perpendicular to the optical axis of the other of the subassembly and in parallel to the optical axis of one of the subassembly.

According to another embodiment of the invention, where the circuit board provides an extension extending along the optical axis of one of the subassembly, which is equivalent to the longitudinal direction of the transceiver, the flexible printed circuit board is configured to be bent at a side edge of the extension to a direction substantially in perpendicular to the circuit board to form a connecting portion.

The end portion of the connecting portion is preferable to provide a rigid substrate with a plurality of via holes each receives a corresponding lead pin that extends from the other of the subassembly.

DESCRIPTION OF PREFERRED EMBODIMENTS

Next will describe preferred embodiments of the present invention. In the description of drawings, the same numerals or symbols will refer to the same elements without overlapping explanation.

Figure 1:
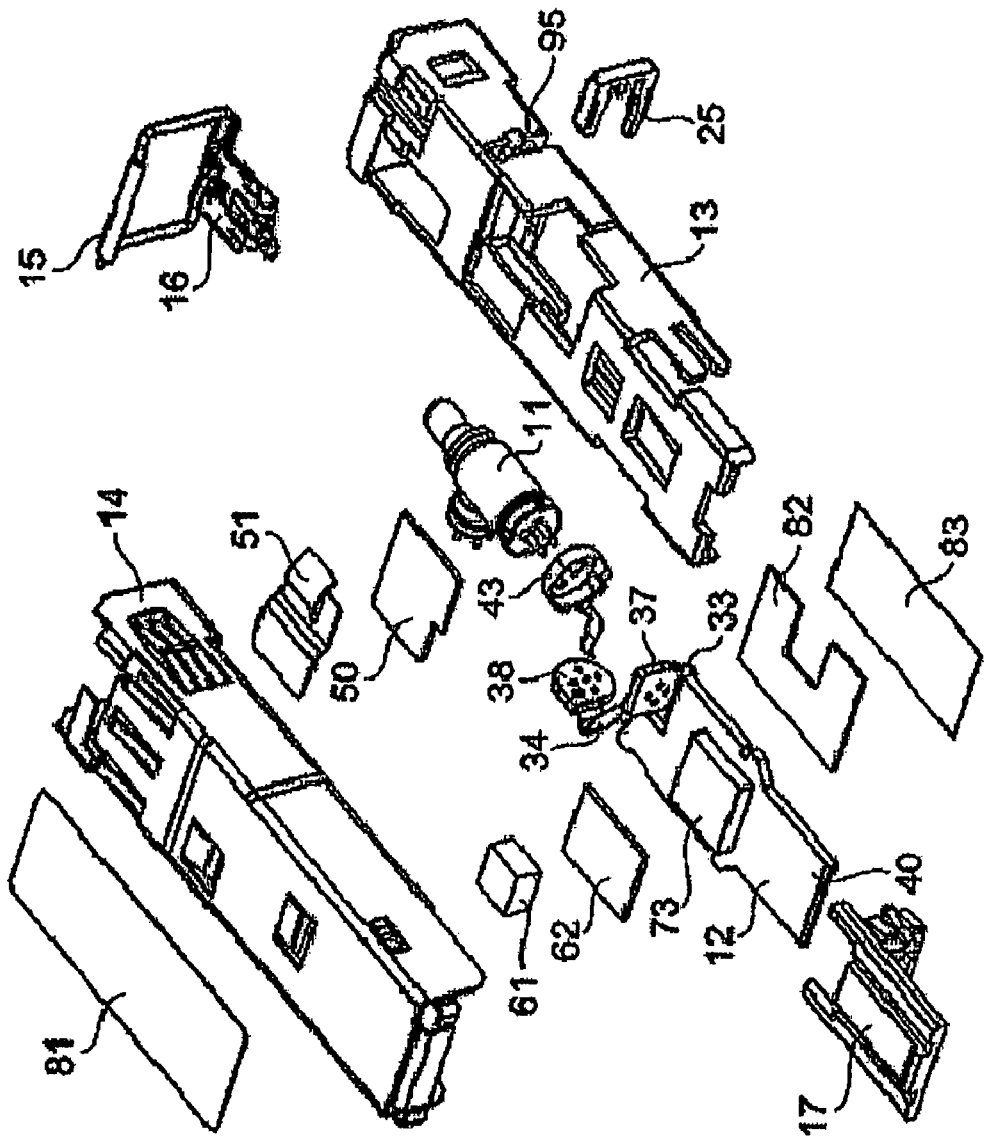
FIG. 1 is an exploded view showing an optical transceiver according to an embodiment of the present invention.

FIG. 1 is a perspective exploded view of an optical transceiver according an embodiment of the invention. The optical transceiver 10 installs a bi-direction optical sub-assembly 11, which is hereinafter called as BOSA, a circuit board 12 that mounts an integrated circuit 73 electrically connected with the BOSA 11, a housing 13 that installs the BOSA 11 and the circuit board 12 as defining the positions thereof, and a metal cover 14 for shielding the BOAS 11 and the circuit board 12. The circuit board 12 provides an EMI (Electro-Magnetic Interference) sheet 82 and an insulating film 83 stacked with the EMI sheet 82.

The optical transceiver 10 is, what is called as the pluggable optical transceiver, communicates with the host system by inserting the transceiver into the cage mounted on the host system and engaging the electrical plug 40 provided in the rear end of the circuit board 12 with the connector installed in the deep end of the cage. The housing 13 of the transceiver 10 provides a mechanism to engage or to disengage the transceiver 10 with the cage. The mechanism includes a bail 15 and an actuator 16. Further, in order to smoothly insert the plug 40 into the connector, the housing 13 holds the circuit board 12 via an sub-holder 17 that positions the electrical plug 40 with respect to the housing 13.

Figure 2:
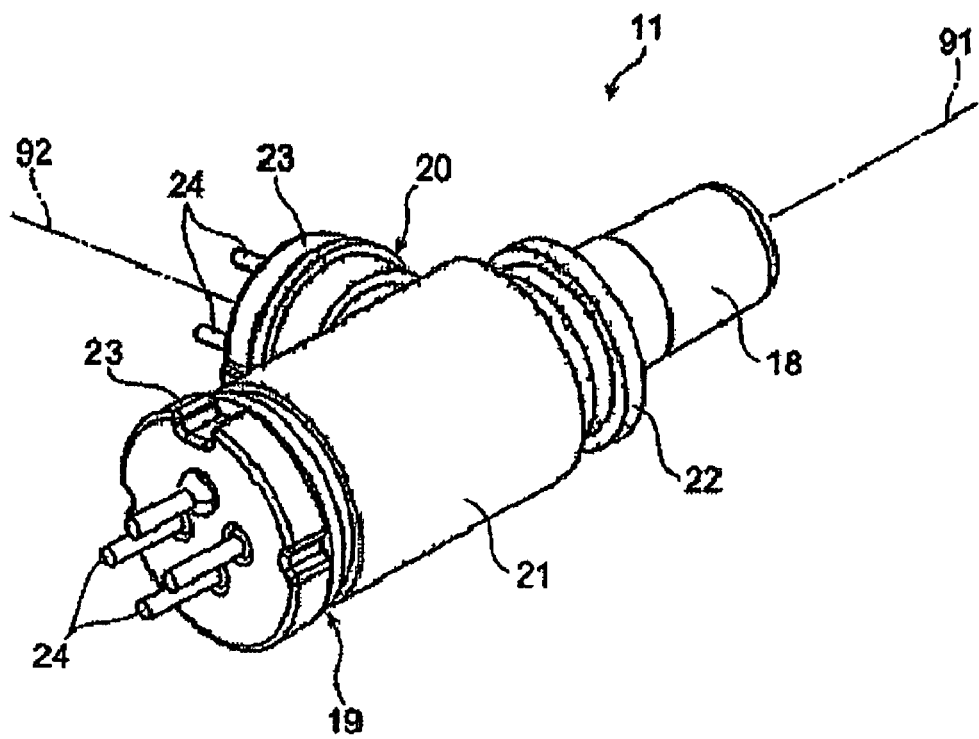
FIG. 2 shows an embodiment of a bi-direction optical sub-assembly installed in the optical transceiver shown in FIG. 1.

FIG. 2 is an outside appearance of the BOSA 11. The BOSA 11 assembles a sleeve shell 18 with a cylindrical shape that receives an optical fiber with a TOSA (Transmitter Optical Sub-Assembly) 19 and a ROSA (Receiver Optical Sub-Assembly) 20 into a unified body, the outside appearance of which shows, as illustrated in FIG. 2, a T-shape such that two OSAs, 19 and 20, in optical axes thereof are arranged with the sleeve shell 18 by substantially right angle to each other. That is, the TOSA 19 faces the sleeve shell 18, while, the ROSA 20 is arranged in a direction substantially right angle to the axis connecting the sleeve shell 18 and the TOSA 19. The optical fiber within the sleeve shell 18 and that of the TOSA 19 have the common axis 91, while, the axis 92 of the ROSA makes a substantial right angle to the axis 91.

Figure 3:
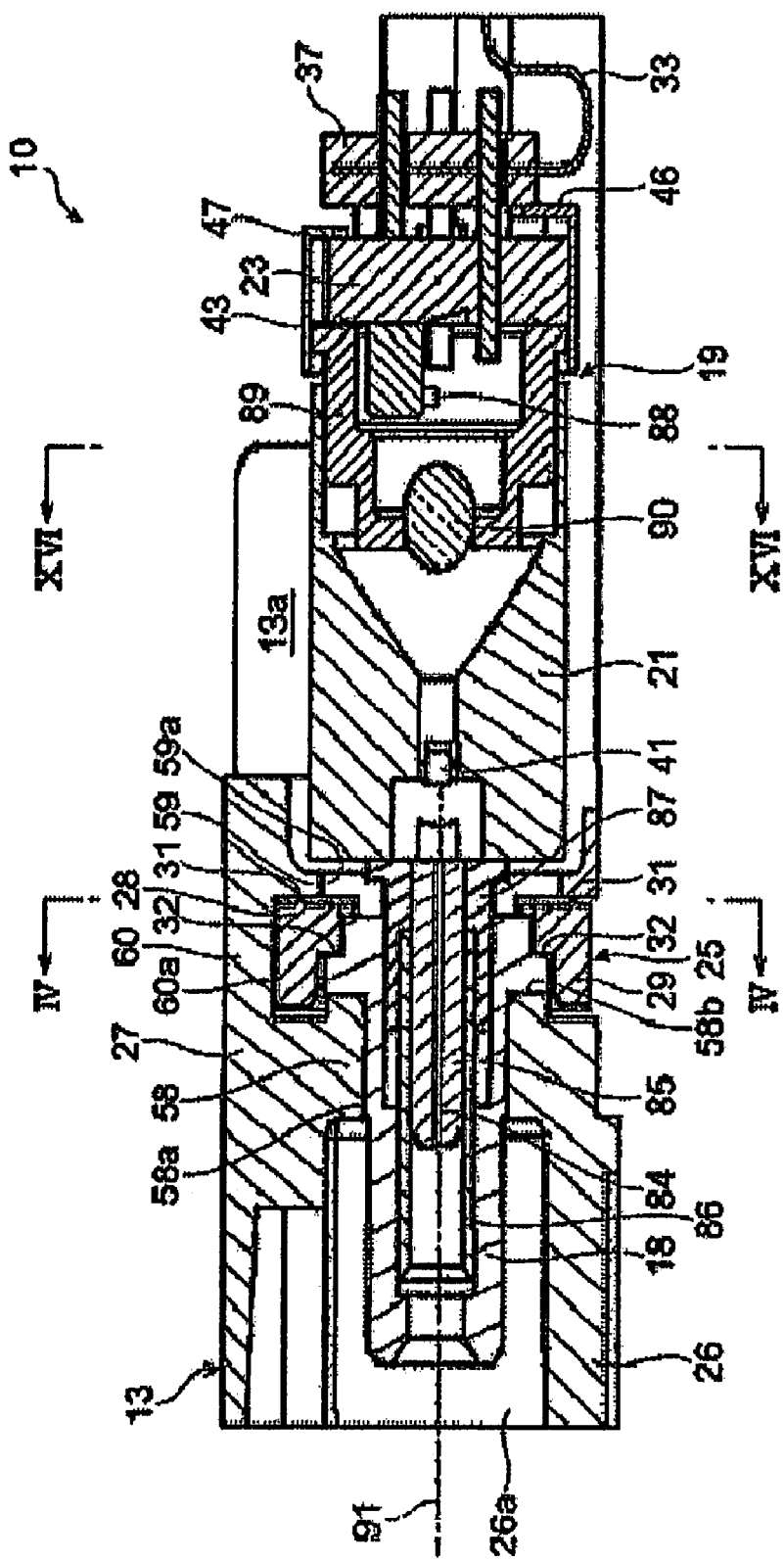
FIG. 3 is a cross sectional view of the optical transceiver taken along a longitudinal axis of the transceiver.

FIG. 3 is a cross section along the longitudinal axis of the transceiver 10, which shows the housing 13 assembles the BOSA 11. FIG. 3 does not illustrate the cover 14, the thermal sheet 50 and the EMI sheet, which will be described later in detail. As shown in FIG. 3, the sleeve 18 secures a stub 85 that also has a cylindrical shape and holds a coupling fiber 84 in a center thereof. A most part of the stub 85 except a root portion is covered with the sleeve 86. The bush 87 holds the root portion of the sleeve 86 as well as that of the stub 85. That is, the sleeve shell 18 is assembled so as to cover the sleeve 86 and a portion of the bush 87 except the root portion thereof where the end portion of the body 21 fixes.

Both the TOSA 19 and the ROSA 20 have, what is called, a CAN-type package. The TOSA 19 and the ROSA 20 provide the disk-shaped stem made of metal that a semiconductor optical device mounts thereon. The device may be a light-emitting device such as laser diode for the TOSA 19, while, may be a light-receiving device such as photodiode for the ROSA 20. These devices may electrically communicate with the outside through a plurality of lead pins 24 secured with the stem 23. The lead pins 24 extend from the stem 23 substantially in right angle thereto. Accordingly, the lead pins 24 of the ROSA 20 make a substantially right angle with respect to the optical axis 91 of the TOSA 91.

The stem 23 of the TOSA 19 provides a cap 89 that encloses the light-emitting device 88 within a space formed together with the stem 23. The cap 89 configures the CAN-type package together with the stem 23 and includes a ceiling with an opening into which the lens 90 is assembled. This lens 90 optically couples the TOSA 19 with the coupling fiber 84 in the stub 85. These arrangements of the stem 23 and the cap 89, as well as the sleeve shell 18, the sleeve 86, the stub 85 and the bush 87, are reflected in the arrangement of the ROSA 20.

The body 21, which has also a cylindrical shape, assembles the sleeve shell 18, the TOSA 19 and the ROSA 20. In addition, the body 21 installs a WDM (Wavelength Division Multiplexed) filter 41. The TOSA 19 emits light with a wavelength thereof in a 1.3 μm band to the coupling fiber 84, while, the ROSA 20 receives light with a wavelength thereof in a 1.55 μm band from the coupling fiber 84. The WDM filter 41 passes the light with the 1.3 μm band from the TOSA 19 to the coupling fiber 84, while, it reflects the light with the 1.55 μm band from the coupling fiber 84 to the ROSA 20.

The present embodiment configures that the TOSA 19, the ROSA 20, the body 21 and the sleeve shell 18 has jackets made of metal. However, these elements may have resin jackets with a metal coating.

The housing 13 of the transceiver 10 installs these TOSA 19, ROSA 20 and body 21. The front end of the housing 13 provides an optical receptacle 26 with a cavity 26a that receives an optical connector secured in a tip of the transmission fiber. The tip of the sleeve shell 18 extrudes into the cavity 26a. Between the cavity 26a and the housing 13 is provided with a partition 27 with openings extending from the cavity 26a to the housing 13. This opening receives a portion of the sleeve shell 18 except the tip thereof.

The partition 27 comprises a front wall 58, a rear wall 59 and an intermediate wall 60 connecting the front and rear walls. The front wall 58 forms the opening 58a continuous to the cavity 26a, while the rear wall 59 forms another opening 59a continuous to the housing 13. The intermediate wall 60 provides an opening 60a, which is relatively wider compared to other openings, 58a and 59a. The rear surface 58b of the front wall 58 and the front surface 59b of the rear wall 59 expose in the opening 60a. Thus, openings, 58a to 60a, connect the housing 13 to the cavity 26a, and the rear surface 58b of the front wall and the front surface 59b of the rear wall 59 make substantially in a right angle to the optical axis 91.

The opening 58a in the front wall 58 has a circular cross section, an inner diameter of which is almost equal to an outer diameter of the sleeve shell 18. This opening 58a receives a portion of the sleeve shell 18 continuous to the tip thereof, which defines the position of the BOSA 11 along to directions perpendicular to the axis 91. The tip of the sleeve shell 18 reaches in the cavity 26a of the receptacle 26 to optically couple with the external optical connector.

A length of the sleeve shell 18 that intrudes into the cavity 26a depends on the standard of the optical connector. The root of the sleeve shell 18, namely, a side close to the body 21, forms a flange 22 to decide the position of the BOSA 11 to the housing 13. This flange 22 abuts against the rear surface 58b of the front wall 58, which defines the tip length of the sleeve shell 18 that intrudes into the cavity 26a and the position of the BOSA 11 along to the optical axis 91.

Only abutting the flange 22 against the rear surface 58a of the front wall 58 is not enough to secure the reliable optical coupling with the optical connector. To insert the optical connector into the cavity 26a to couple with the sleeve shell 18 causes a rear shift of the BOSA 11 because the movement of the BOSA 11 to the rear is not restricted at all. Accordingly, the present transceiver 10 controls this rear shift of the BOSA 11 by mating a holder 25 into the opening 60 of the intermediate wall 60.

Figure 4:
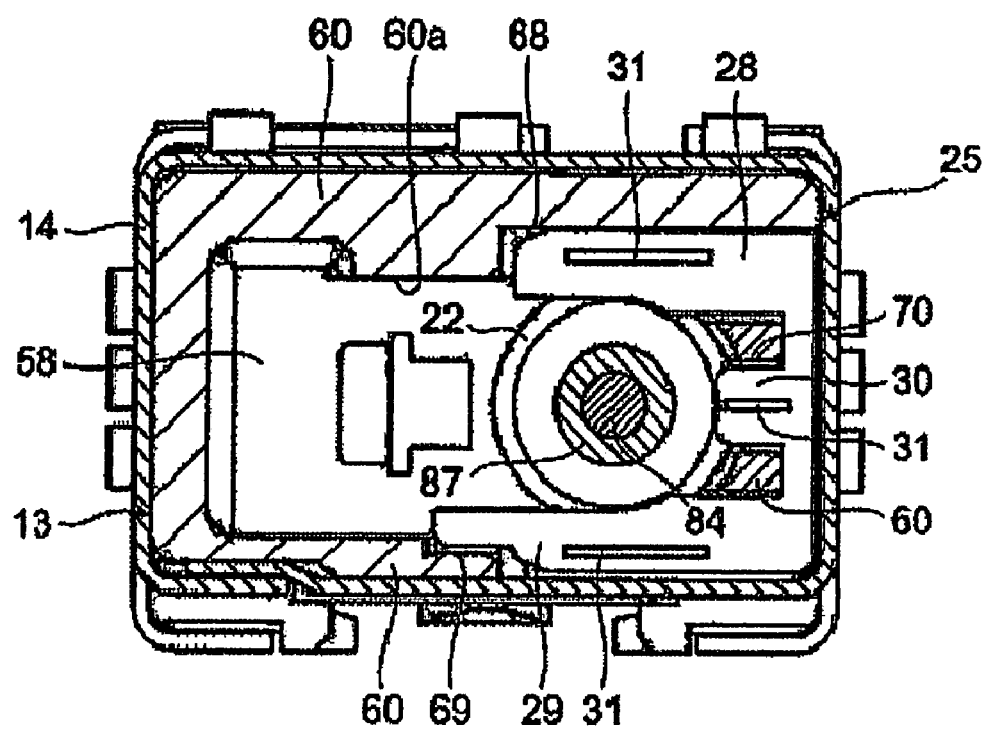
FIG. 4 is a cross sectional view taken along the line IV-IV in FIG. 3.
Figure 5:
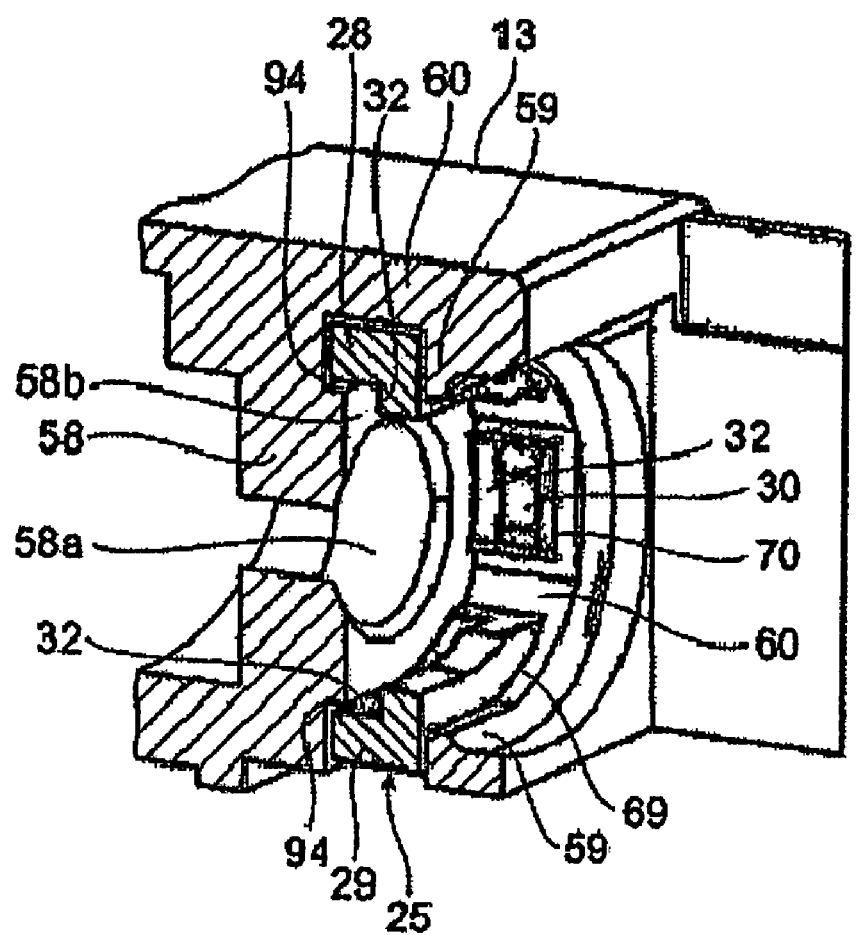
FIG. 5 is a partial broken view of a front portion of the transceiver that omits the bi-directional optical sub-assembly to show a holder.
Figure 6A:
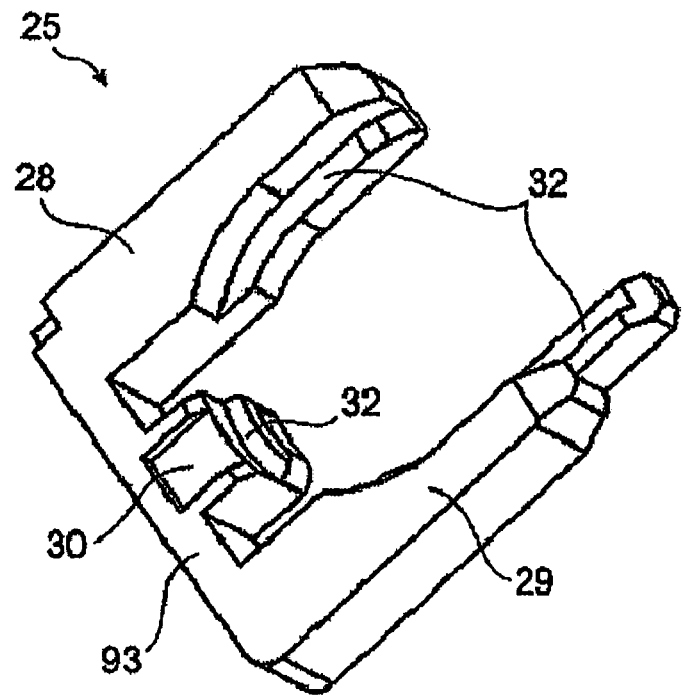
FIGS. 6A and 6B are perspective views of the holder.
Figure 6B:
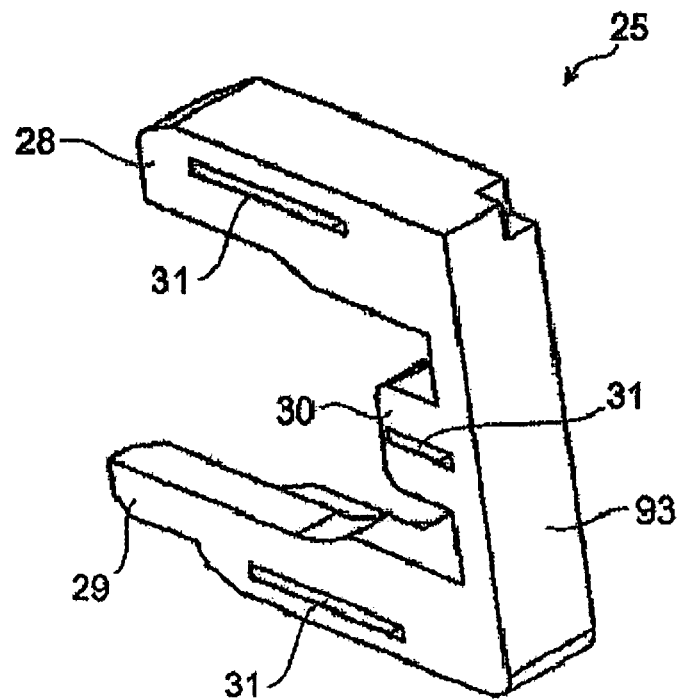

Next will describe the holder 25, in particular, an operation and a function thereof in detail as referring to FIGS. 4 to 6. FIG. 4 is a partial cross sectional view taken along the line IV-IV in FIG. 3, FIG. 5 is a partial cross sectional view of the holder 25 where the BOSA 11 is supposed to be removed, and FIGS. 6A and 6B are perspective drawings of the holder 25 viewed from the front and rear, respectively.

As shown in FIG. 6, the holder 25 has an U-shape that provides upper and lower legs, 28 and 29, which extend substantially in parallel to each other, and a support 93 connective these legs, 28 and 29. The lower leg 29 extends longer relative to the upper leg 28. On the support 93 is formed with a center leg 30 between the upper and lower legs, 28 and 29, and extrudes substantially in parallel to those legs, 28 and 29. The protruding length of the center leg 30 from the support 93 is shorter than the length of two legs, 28 and 29.

As shown in FIGS. 4 and 5, the upper, lower and center legs, 28, 29 and 30, are fitted into respective pockets, 68, 69 and 70, formed in the intermediate wall 60 of the partition 27. These legs, 28 to 30, come in contact with the jacket of the sleeve shell 18 so as to put the shell 18 therebetween. These pockets, 68 to 70, connect with the slit 95 formed in the side of the housing 13, and this slit 95 receives the support 93 of the holder 25. That is, the holder 25 is fitted within the intermediate wall 60 of the partition 27. As shown in FIG. 5, a portion of the pockets, 68 to 70, reaches the front wall 58 to make a step 94 in the rear surface 58b of the front wall 58. Front sides of the legs, 28 to 30, are set within the step 94.

As shown in FIG. 6A, the legs, 28 to 30, form steps 32 in a side facing the flange 22 of the sleeve shell 18. These steps 32 receive the flange 22, as shown in FIG. 3, to securely fix the sleeve shell 18 by the upper and loser legs, 28 and 29, in up and down.

Surfaces opposite to that providing the steps 32 of respective legs, 28 to 30, provide ribs 31, whose cross section is a triangle. The rib 31 crashes when the legs, 28 to 30, are put into the pockets, 68 to 70. That is, widths of respective pockets, which is a length along the longitudinal axis of the transceiver 10, are set to be slightly smaller than a sum of the thickness of the flange 22, a thickness of a portion of the holder 25 that fits with the flange 25 and a height of the rib 31, and to be slightly greater than a sum except the height of the rib, namely, a sum of the thickness of the flange 22 and the portion of the holder 25 that fits with the flange 22.

When the legs, 28 to 30, are inserted into the pockets, 68 to 70, these ribs are to be crashed between the legs, 28 to 30, and the front surface 59b of the rear wall 59, which presses the step 32 of legs, 28 to 30, against the flange 22 and, thus, the flange 22 is pressed against the rear surface 58b of the front wall 58. The holder 25 and the flange 22 are put between two walls, 58 and 59, and positioned therein, which prevents the holder 25 from slipping out from the pockets.

Further, the arrangement of the holder described above, where the one surface of the flange 22 abuts against the rear surface 58b of the front wall 58, while the other surface of the flange 22 abuts against the front surface 59b of the rear wall 59 through the rib 31 of each legs, 28 to 30, prevent the BOSA 11 from sliding along the axis 91, which means that, in addition to the insertion of the sleeve shell 18 in to the opening 58a, the position of the BOSA 11 may be securely determined within the transceiver 10 not only the directions perpendicular to the axis 91 but also along the axis 91.

Thus, only the insertion of the legs, 28 to 30, into respective pockets, 68 to 70, not only puts the BOSA 11 between the upper and lower legs, 28 and 29, but also fixes the holder 25 to the housing 13, which means that the fixing of the BOSA 11 to the housing and the positioning of the BOSA 11 with respect to the housing are completed at the same time. Thus, the assembly of the transceiver 10 may be simplified. In particular, the upper and lower legs, 28 and 29, are mated with respective and independent pockets, 68 and 69, which makes it smooth to assemble the holder 25 with the housing compared to a case when both legs, 28 and 29, are mated with one and common pocket.

The present arrangement fixes the sleeve shell 18 to the housing 13, not the TOSA 19 or the ROSA 20, which enhances the flexibility of the outer shape of the TOSA 19 or the ROSA 20 as well as the positions thereof within the housing 13.

The present embodiment of the holder provides the center leg 30. However, the center leg 30 is not always required. Only the upper and lower legs, 28 and 29, may fix and position the BOSA 11 with respect to the housing 13. The center leg 30 may be possible to support the flange 22 at three positions in addition to the upper and lower legs, 28 and 29, which enhances the reliability of the fixing and the positioning of the flange 22. The length of the center leg 30, the length protruding from the support 93, is preferable so as not to push the sleeve shell 18 when the holder 25 is engaged with the housing 13. Pushing and pressing the sleeve shell 18 may induce the displacement of the optical axis.

The present embodiment inserts the holder 25 from the side of the housing 13. However, the insertion of the holder 25 is not restricted to that mentioned above. Other directions, from the top, bottom and the other side opposite to that described in the embodiment may be applicable.

Referring to FIG. 1 again, a flexible printed circuit (FPC) board 34 electrically connects the BOSA 11 with the circuit board 12. As described, the TOSA 19 and the ROSA 20 are positioned with substantially right angle to each other because of the optical coupling request. Accordingly, the electrical connection between the TOSA 19 and the ROSA 20 with the circuit board 12 is necessary to reflect the physical disposition of both assemblies.

Figure 7:
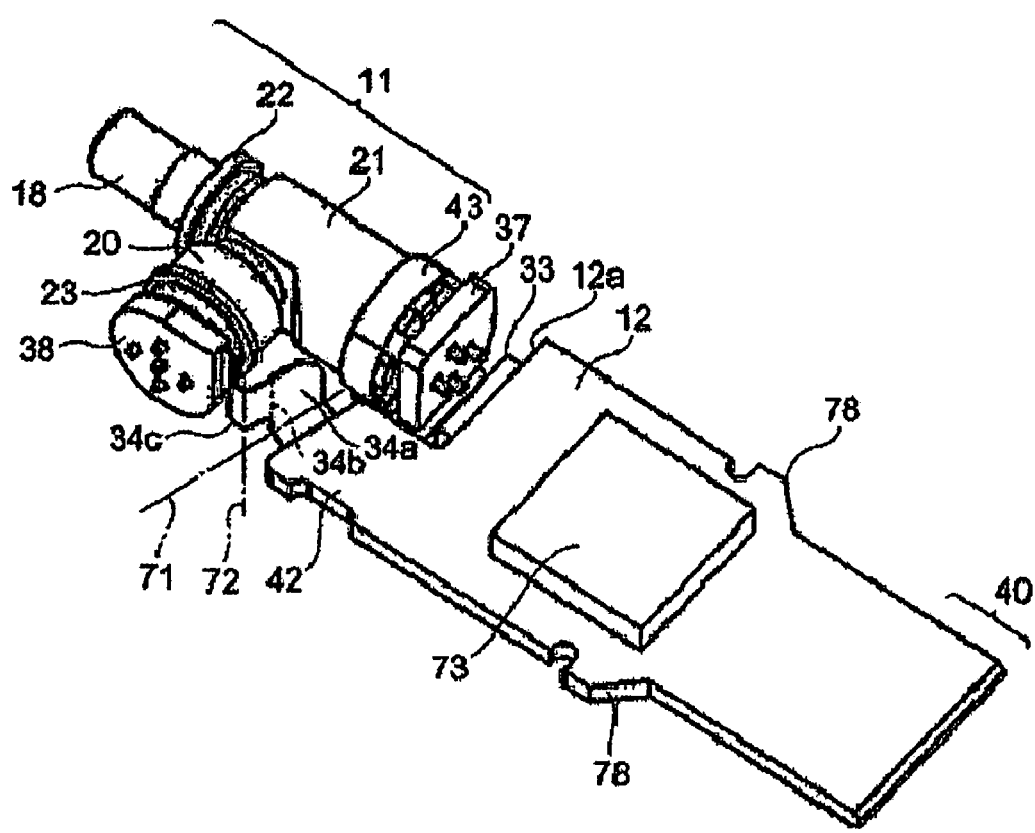
FIG. 7 is a perspective view showing the bi-directional optical sub-assembly built with the circuit board.
Figure 8:
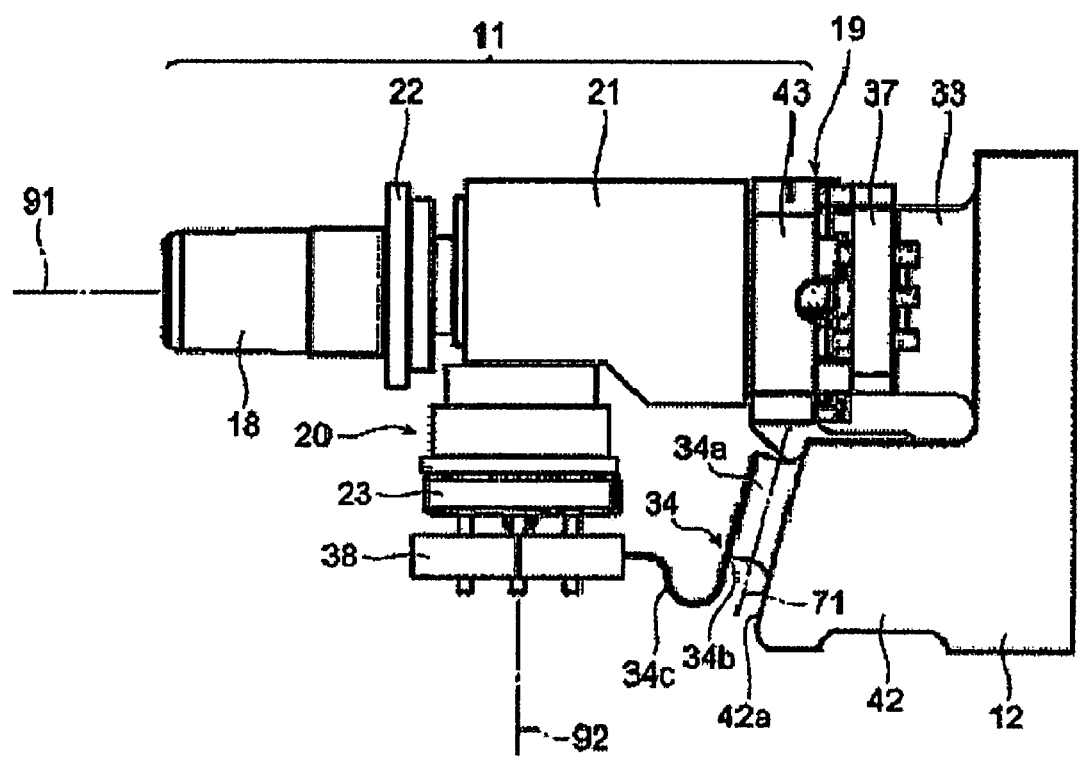
FIG. 8 is a plan view showing the connection between the bi-directional optical sub-assembly and the circuit board.

FIGS. 7 and 8 are perspective and plan views to show the connection between the BOSA 11 and the circuit board 12, respectively. The circuit board 12 shapes a rectangle prolonged along the longitudinal axis of the transceiver 10. The rear end of the circuit board 12 forms the electrical connector plug 40. On the plug 40 is provided with a plurality of interconnecting patterns extended from the inside of the circuit board 12. Inserting the transceiver 10 into the cage 20 and mating this plug 40 with the electrical connector in the deep end of the cage, these interconnecting patterns come in contact with the electrodes of the connector.

The front end of the circuit board 12 forms a large cutting in one side thereof, in which the stem 23 of the TOSA 19 positions. The FPC board 33 extends from the edge of this cutting to connect with the TOSA 19. As shown in FIG. 3, the FPC board 33, once bending downward to the circuit board 12, bends upward so as to be substantially in parallel to the stem 23, which makes the FOC board 12 in a U-shape. The end of the FPC board 12 provides a rigid substrate 37 to receive the lead pins 24 of the TOSA 19.

The other front side of the circuit board 12 extends from the edge 12a to form an extension 42, which protrudes along the axis 91 of the TOSA 19 toward the ROSA 20. The front end 42a of the extension 42 connects the other circuit board 34 toward the stem 23 of the ROSA 20. This FPC board 34, extending from the end 42a, is bent upward with respect to the circuit board 12 to form a vertical potion 34a. One side 34b of this vertical portion 34a is bent again frontward toward the ROSA 20 to form a connecting portion 34c. The connecting portion 34c provides in the front end portion thereof a rigid substrate 38 to receive the lead pins of the ROSA 20. As shown in FIG. 8, the connecting portion 34c is bent so as to form a U-shape in the cross section thereof, bent again at a point close to the rigid substrate 38, and finally combined with the rigid substrate 38 in substantially parallel to the stem 23 of the ROSA 20.

The vertical portion 34a is formed, as shown in FIG. 8, by bending the FPC board 34 along the line 71. This line 71 is substantially in parallel to the edge 42a of the extension 42 in a plane including two axes, 91 and 92, but not in parallel to the axis 92 of the ROSA 20 with a substantial angle therebetween. To bend the FPC board 34 along the line 71 makes it possible to relax the bending of the FPC board 34 again in the connecting portion 34c, accordingly, to enhance the reliability of the electrical connection by the FPC board 34.

The circuit board 12 in the transceiver 10 has a type of multi-layered configuration that stacks the wiring layer and the cover layer made of resin as an intermediate layer. These wiring and cover layers extend to the FPC boards, 33 and 34. Further, the rigid substrates, 37 and 38, that secure the lead pins 24 of the TOSA 33 and the ROSA 34 also have the multi-layered configuration. The wiring layer and the cover layer of the FPC boards, 33 and 34, are also staked within the rigid substrates, 37 and 38. Thus, the lead pins 34 may be directly connected to the FPC boards, 33 and 34, within the rigid substrates, 37 and 38.

The FPC boards, 33 and 34, of the present invention receive relatively large stress because the direction of the lead pins 24 of the TOSA 19 and the ROSA 20 are different by about right angle in the BOSA 11, accordingly, the FPC boards, 33 and 34, are necessary to be bent with a large curvature to connect the boards, 33 and 34, with the lead pins 24. An arrangement where the circuit board 12 or the rigid boards, 37 and 38, are separated in a material thereof from the FPC boards, 33 and 34, may be hard to receive this relatively large stress of the FPC boards, 33 and 34. Therefore, the transceiver according to the present embodiment provides the arrangement where the wiring layer and the cover layer of the FPC boards, 33 and 34, continue within the circuit board 12 and the rigid boards, 37 and 38, which makes the FPC boards, 33 and 34, and the circuit board 12 and the rigid boards, 37 and 38, in one unit in order to ensure the enough reliability even when the FPC board is bent with a large curvature.

Figure 9:
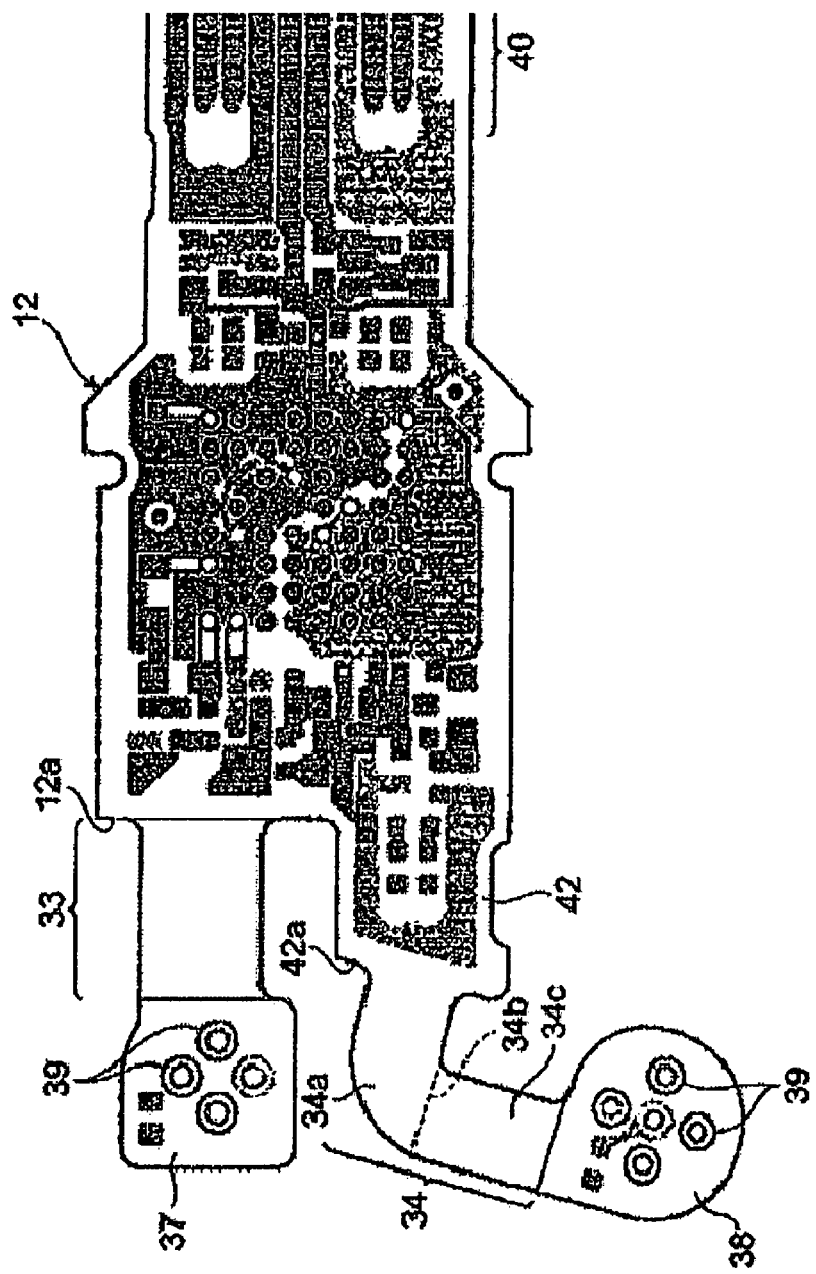
FIG. 9 is a plan view showing an example of the circuit board with a flexible printed circuit board before connected with the bi-directional optical sub-assembly.

FIG. 9 is a plan view of an example of the circuit board 12 and the FPC boards, 33 and 34, before it is installed with the BOSA 11. FIG. 9 shows the FPC boards, 33 ad 34, in a stretched state. The FPC board 33 for the TOSA 19 is put between the edge 12a of the circuit board 12 and the rigid substrate 37 for the TOSA 19. The rigid substrate 37 forms four via holes 39 that electrically connect with the lead pins 24 of the TOSA 19. These via holes, namely, the lead pins 24 of the TOSA 19, corresponds to Sig, Vcc, GND and Mon, where Sig is a signal to be input in the TOSA 19, Vcc means the power supply, GND means the ground and Mon corresponds a monitoring signal showing an optical output power from the light-emitting device installed in the TOSA 19. The rigid substrate 37 mounts a chip capacitors connected between the power supply Vcc and the ground GND to stabilize the power supply Vcc.

The other FPC board 34 for the ROSA 20 extends from the edge 42a of the extension 42 toward the TOSA 19, forms the vertical portion 34a and extends the connecting portion 34c from the side 34b of the vertical portion 34a to reach the rigid substrate 38 for the ROSA 20. The surface of the rigid substrate 38 appeared in FIG. 9 becomes an outer surface, a surface not facing the stem 23 of the ROSA 20, when the FPC board 34 is practically connected with the ROSA 20.

The arrangement thus described makes it possible to assemble the end of the connecting portion 34c in substantially parallel to the stem 23 of the ROSA 20 without twisting the FPC board 34 to electrically connect with the lead pin 24. Because the twisting of the FPC board 34 is unnecessary in the present embodiment, the FPC board 34 is hard to snap or to break the wiring on the FPC board 34, which may enhance the electrical connection between the ROSA 20 and the circuit board 12.

The connection portion 34c of the present embodiment is bent by a line 72 that is perpendicular to both axes, 91 and 92, for the TOSA 19 and the ROSA 20, which configures the cross section of the connecting portion 34c in a U-shape. Such arrangement of the connecting portion 34c makes the end portion thereof substantially in parallel to the stem 23 of the ROSA 20 without twisting the board 34c.

Further, the present transceiver 10 forms the extension 42 that protrudes toward the ROSA 20 with respect to the edge 12a from which the other FPC board 33 extends toward the TOSA 19, and the FPC board 34 for the ROSA 20 extends from the edge of the extension 42. Thus, such arrangement may shorten the length of the FPC board 34 by the length of the extension 34, which enables to suppress the degradation of the signal quality in high frequencies.

As shown in FIG. 8, the edge 42a of the extension makes a substantial angle to the axis 92 of the ROSA 20, and the FPC board 34 extends toward a direction perpendicular to this edge 42a. Accordingly, the FPC board 34 extends from the edge 42a so as to approach the TOSA 19 to form the vertical portion 34a. The connecting portion 34c extends from a far side to the TOSA 19 of the vertical portion 34a so as to go apart from the TOSA 19.

Thus, the arrangement of the FPC board 34, once extends to approach the TOSA 19 and next to go away from the TOSA 19, is to prevent the curvature of the FPC board 34 from being large when it is bent to connect the portion 34c with the ROSA 20. The two-fold bent portion provided in the FPC board 34 enables to form the vertical portion 34a so as to incline to the stem 23 of the ROSA 20. As shown in FIG. 8, the vertical portion 34a inclines so as to approach the stem 23 from the near side to the far side of the TOSA 19. Comparing a case where the vertical portion 34a is perpendicular to the stem 34, the curvature of the connecting portion 34c may be small because the connecting portion 34c extends from the far side 34b of the vertical portion 34a by an obtuse angle to the stem 23, which makes it hard to cause a breaking of the wiring on the FPC board 34.

The rigid substrate 38 forms five via holes 39 that correspond to, Out, /Out, Vcc, Vpd and GND. A pair of Out and /Out means a complementary output from the ROSA 20 which corresponds to the optical signal received by the light-receiving device 19. Vcc and GND are a power supply and the ground thereof to be supplied to the ROSA 19. Vpd is a bias supplied to the light-receiving device in the ROSA 20.

The circuit in the TOSA 19 is connected with the circuit on the circuit board 12 via the FPC board 33. Similarly, the circuit in the ROSA 20 that includes the light-receiving device 20 is connected with the circuit on the circuit board 12 with the FPC board 34. The wiring pattern on the FPC board 34 is impedance matched with the circuit on the circuit board 12 as well as the circuit within the TOSA 19. Similarly, the wiring pattern for Out and /Out on the FPC board 34 are impedance-matched with the circuit within the ROSA 20 as well as the circuit mounted on the circuit board 12. The impedance-matching condition of the wiring on the FPC boards, 33 and 34, depends on widths of the wirings, and the dielectric constant and a thickness of the cover layer. The impedance-matched wiring pattern may suppress the degradation of the signal quality propagated on the wiring even when the signal frequency exceeds 1 GHz.

Figure 10:
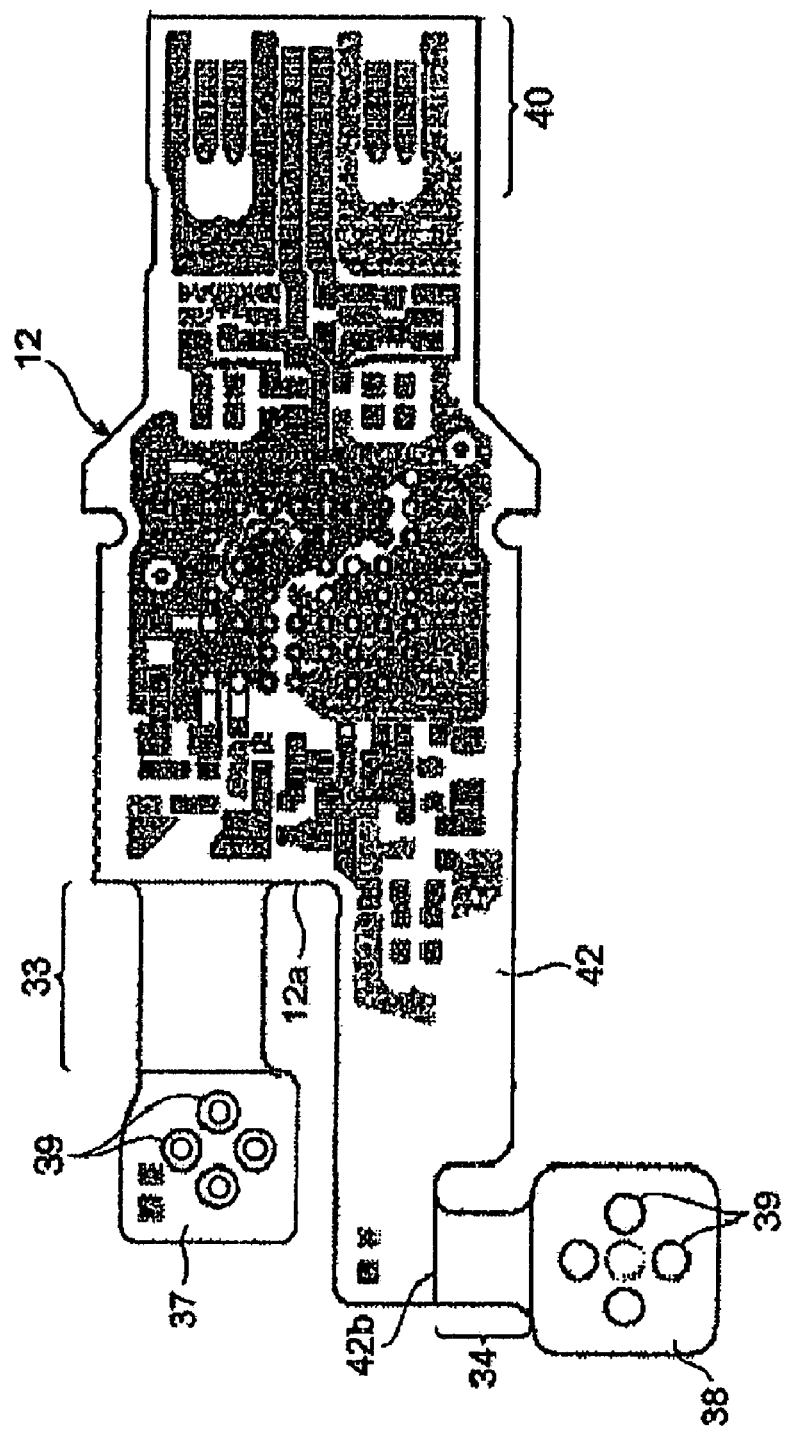
FIG. 10 is a plan view showing another example of the circuit board with the flexible printer circuit board.

FIG. 10 shows another embodiment of the FPC board 34 for the ROSA 20, which illustrates the FPC boards, 33 and 34, in a stretched state before being bent. The example shown in FIG. 9 has the FPC board 34 drawn out from the edge 42 of the extension 42 of the circuit board 12 that extends along the axis 91 of the TOSA 19. The present embodiment shown in FIG. 10 further extends the extension 42 of the board 12 frontward to a portion beneath the ROSA 20. The FPC board 34 extends from an edge 42b of the extension 42 along the axis 92 of the ROSA 20 to connect with the rigid substrate 34 for the ROSA 20. The rigid substrate 38 is connected with the lead pins 24 of the ROSA 20 so as to stand up from the extension 42. The length of the wiring on the FPC board 34 may be shortened compared with the arrangement shown in FIG. 9, and only one bending is necessary in the present case, which further enhances the reliability relating to the physical arrangement of the FPC board 34 and the high frequency performance of the transceiver 10. Moreover, the length of the extension 42 may be longer than a case shown in FIG. 9, which enables to mount parts on the extension and to widen the practical area for installing devices and parts thereon.

In the present embodiment shown in FIG. 10, a surface of the rigid substrate 39, which is opposite to the case shown in FIG. 9, faces the stem 23. That is, the surface of the rigid substrate appeared in FIG. 9 faces outward, namely, not facing the stem 23, while, in the embodiment shown in FIG. 10, the surface appeared in the figure faces the stem 23.

Figure 11:
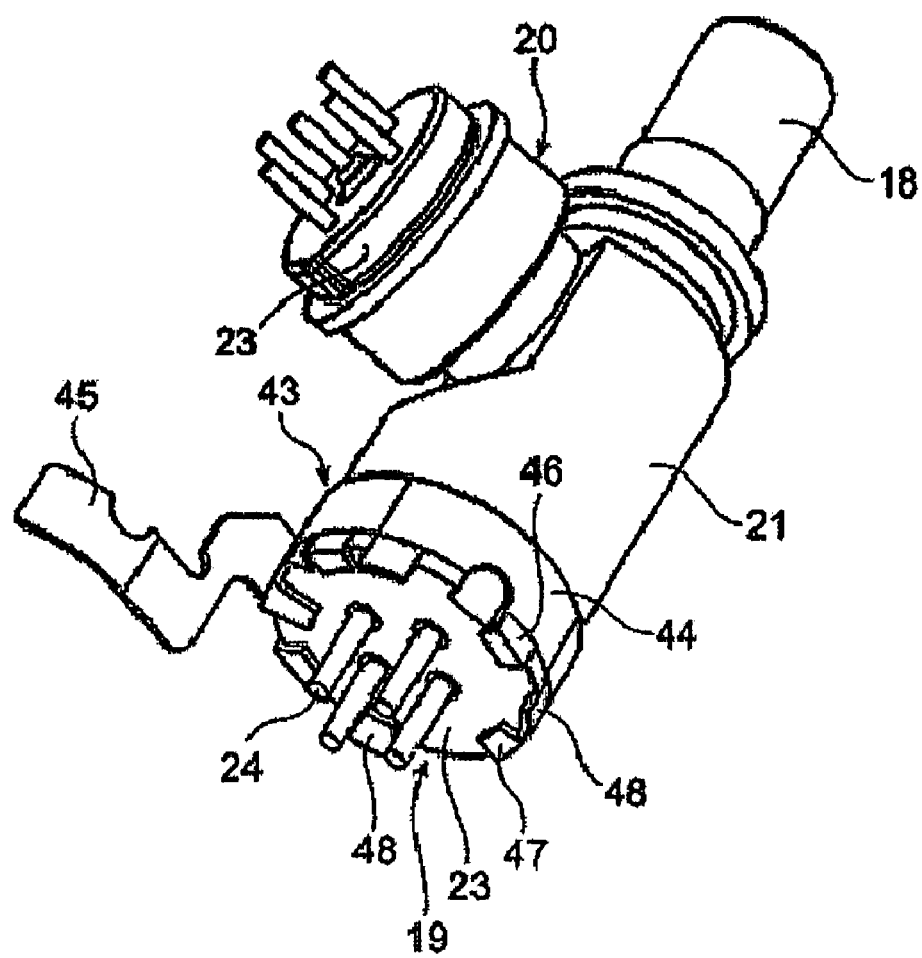
FIG. 11 is a perspective view of the bi-directional optical sub-assembly with a bracket.
Figure 12:
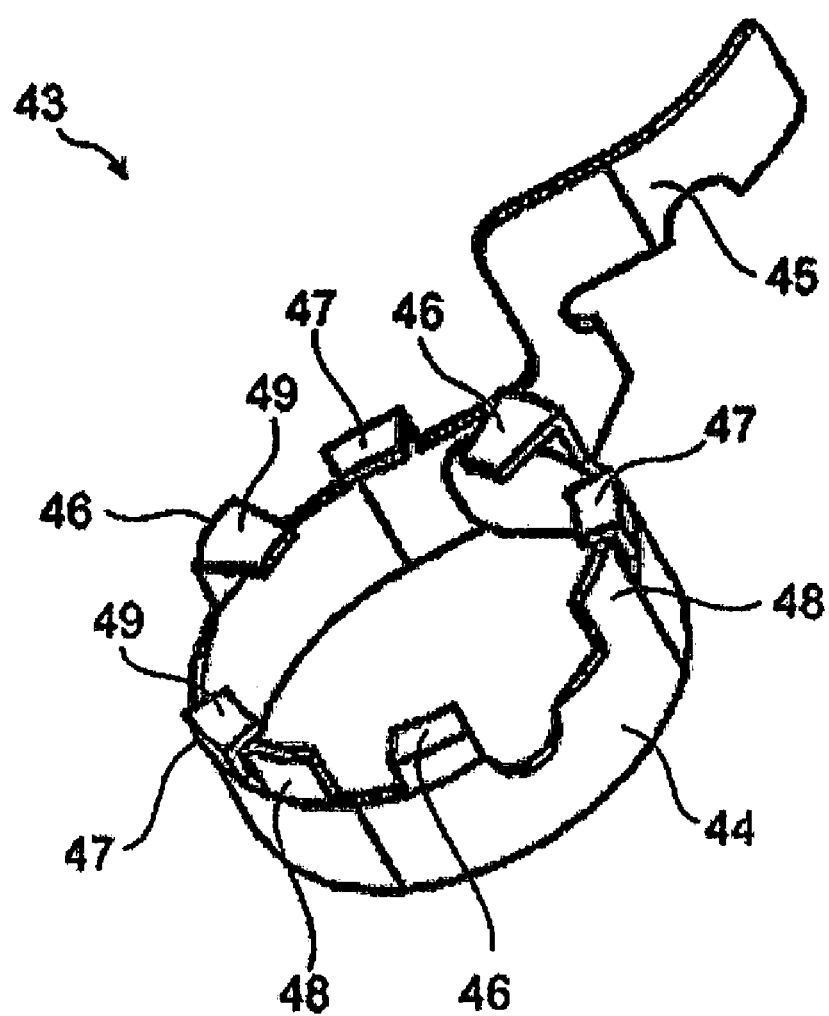
FIG. 12 is a perspective view of the bracket.
Figure 13:
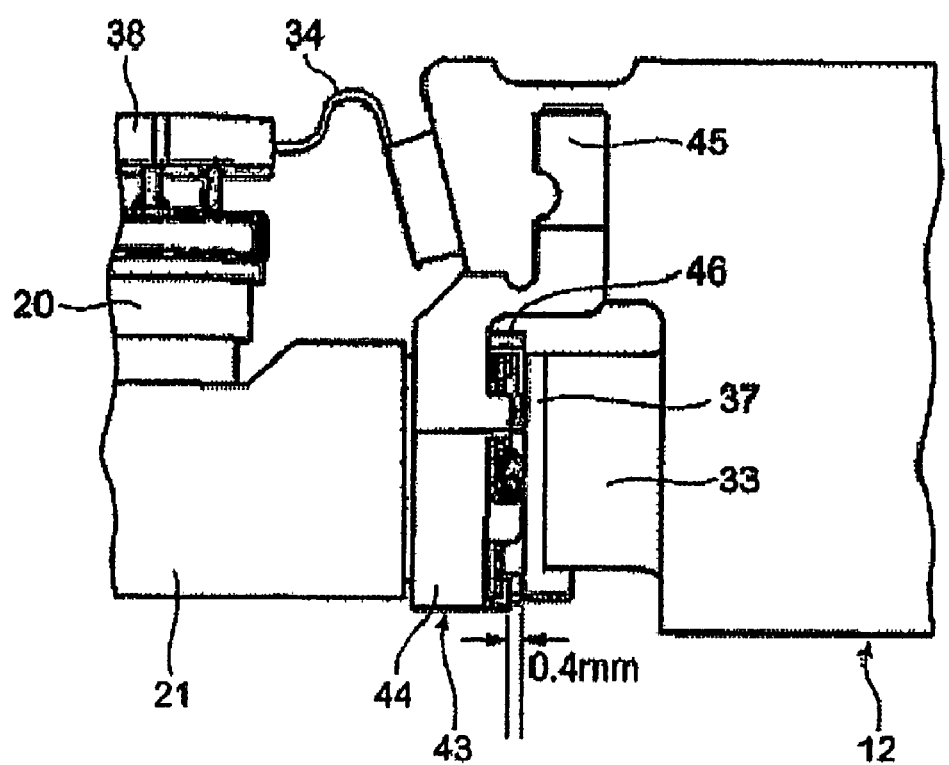
FIG. 13 is a plan view showing a coupling between the bi-directional optical subassembly with the circuit board interposing the bracket therebetween.

Next will describe the bracket 43 attached to the stem 23 of the TOSA 19 as a spacer. FIG. 11 is a perspective view of the TOSA installing the bracket 43 on the stem 23, and FIG. 12 is a perspective view of the bracket 43. FIG. 13 is a plan view that shows the BOSA 11 installed with the bracket 43 connected with the circuit board 12.

In the optical transceiver 10 according to the present embodiment, the package of the TOSA and ROSA are commonly grounded on the ROSA 20 to avoid the interference of the current switching in the TOSA 19 with the small signal operation in the ROSA 20. The package of the TOSA 19, as well as that of the ROSA 20, is connected with the ground of the ROSA 20. However, the signal ground in the TOSA 19, namely, the ground of the light-emitting device and that of the light-receiving device for monitoring the output of the light-emitting device, is isolated from the package of the TOSA 19. Moreover, the ground lead pin attached to the stem 23 of the TOSA 19 is also electrically isolated from the package of the TOSA 19, accordingly, the stem 23 thereof. Installing the transceiver 10 on the host system, the signal ground of the TOSA 19 and that of the ROSA 20 are connected to each other in the host system, thus, the ground lead pin of the TOSA 19 is practically grounded.

Accordingly, it is restricted that the ground lead pin or solder for connecting this lead pin with the via hole 39 in the rigid substrate 37 is physically touched with the package of the TOSA 19. An enough gap is necessary between the stem 23 and the rigid substrate 39 to prevent the surplus solder from extending within the gap due to the capillarity to cause the electrical conduction therebetween.

In another aspect of the present transceiver, the heat dissipation from the TOSA 19 is to be considered because of several reasons. The fiber channel system has been proposed as one of standards of the optical communication and this system may use the bi-directional module such as those disclosed in the present embodiment. The operation speed of the optical communication system, such as fiber channel system, exceeds 1 GHz. In such high speed operation, the heat generation by the LD becomes larger than that by the pre-amplifier installed within the ROSA 20. Moreover, the temperature dependence of the LD is quite larger than that of the pre-amplifier. Accordingly, the TOSA 19 is necessary to provide an effective mechanism for the heat dissipation.

The TOSA 19 according to the present embodiment installs the bracket 43 illustrated in FIG. 12 fitted with the stem 23 thereof. The bracket 43 of the embodiment includes a ring portion with a plurality of tabs, 46 to 38, and a finger 45 extending outward from the ring portion 44. The ring portion 44 and the finger 45 of the present embodiment are made of metal. The ring portion 44 fits the stem 23, while the finger 45 is connected to the ground pattern on the circuit board 12, which establishes a heat conducting path from the stem 23 of the TOSA 19 to the circuit board 12 as well as strengthen the ground path of the TOSA 19.

As illustrated in FIG. 12, a various types of tabs, three taller tabs 46, three shorter tabs 47, and two stopper tabs 48, extend from one edge of the ring portion 44. Taller tabs 46 and shorter tabs 47 are alternately arranged on the edge of the ring portion 44, and each tab provides a tip portion bent inward by about a right angle to form a platform 49. One stopper tab 48 is formed on the edge of the ring portion 44 so as to face the finger 45, while the other stopper tab 48 positions, on the ring portion 44, between the former stopper tab 48 and the finger 45.

Fitting the stem 23 of the TOSA 19 with the ring portion 44, platforms 49 of the shorter tab 47 come in contact with the bottom surface of the stem 23, as shown in FIG. 11. That is, the platform 49 of the shorter tab 47 operates as a stopper for inserting the stem 23 into the ring portion 44. On the other hand, when an assembly of the TOSA 19 with the bracket 43 is coupled with the rigid substrate 37 to insert the lead pin of the TOSA 19 into the via holes 39 in the rigid substrate 37, the platform 49 of the taller tab 46 comes in contact with the rigid substrate 37 to form a gap between the stem 23 and the rigid substrate 37. The gap corresponds to a difference in the height between the shorter tab 47 and the taller tab 46. The gap according to the present arrangement shown in FIG. 11 is set to be about 0.4 mm, which prevents the solder for connecting the lead pin 24 with the rigid substrate 37 from extending by the capillarity and from electrical conducting the lead pin 24, the signal ground pin of the TOSA, with the stem 23. The platform 49 of the shorter tabs 47 may be soldered with the stem to secure the stable electrical contact.

The rigid substrate 38 for the ROSA 20 also has a gap of about 0.4 mm to the stem 23 of the ROSA 20. Because the signal ground of the ROSA 20 is common to the body 21, the ROSA 20 does not require the strictness for the gap to the rigid substrate 38 as that for the TOSA 19. Beside, because the PFC board 34 for the ROSA 20 has a length between the circuit board 12 and the rigid substrate 38 longer than that for the TOSA 19, the curvature of the FPC board 34 becomes relatively small, which makes the stress appeared in the rigid substrate 38 small as compared with that 37 for the TOSA 19.

Accordingly, another tool used in the production of the transceiver different from the bracket 43 may optionally determine the size of the gap between the stem 23 and the rigid substrate 38.

The stopper tabs, 48a and 48b, extend higher than the platform 49 of the taller tab 47. When the FPC board 33 is formed in the U-shape after the TOSA 19 in the lead pin thereof is soldered with the rigid substrate 37 putting the bracket therebetween in order to install this assembly of the TOSA 19 with the bracket 43 and the rigid substrate 37, the FPC board 37 receives repulsive force such that the rigid substrate 37 is pushed up. Under such situation, the stopper tab 48 relaxes this repulsive force by coming in contact with the rigid substrate 37. Without stopper tab 48, the lead pin 48 inserted into the via hole 39, exactly speaking, a root portion of the lead pin 24 is necessary to absorb the whole repulsive force. The stopper tab 48 of the present embodiment may relax the mechanical stress caused in the lead pin 24 and may enhance the reliability of the electrical connection between the TOSA 19 and the circuit board 12.

Figure 14:
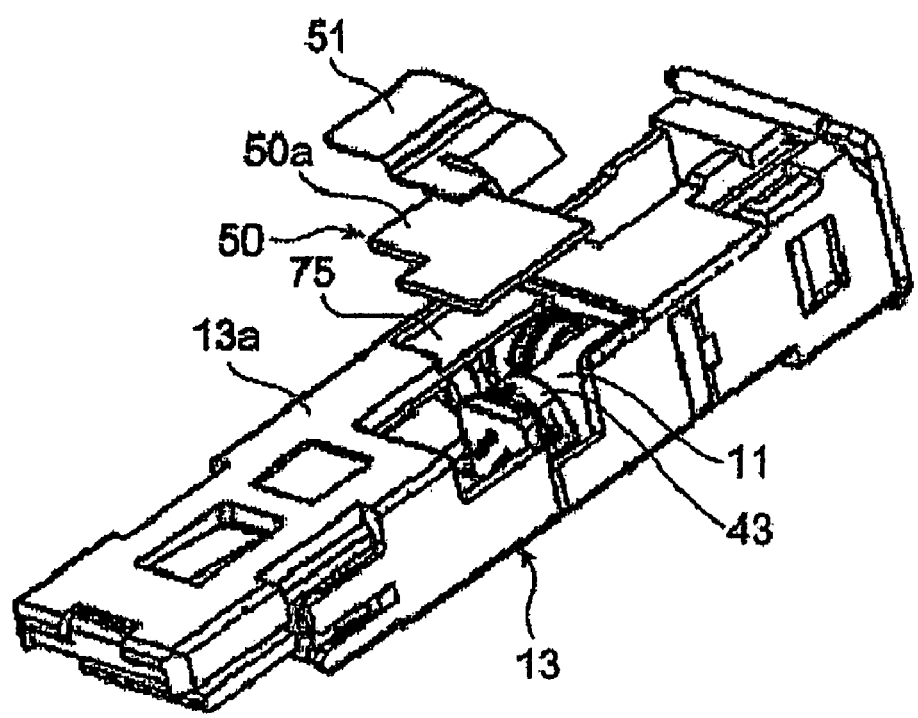
FIG. 14 shows a process for setting the thermal sheet and the EMI sheet in the housing.
Figure 15:
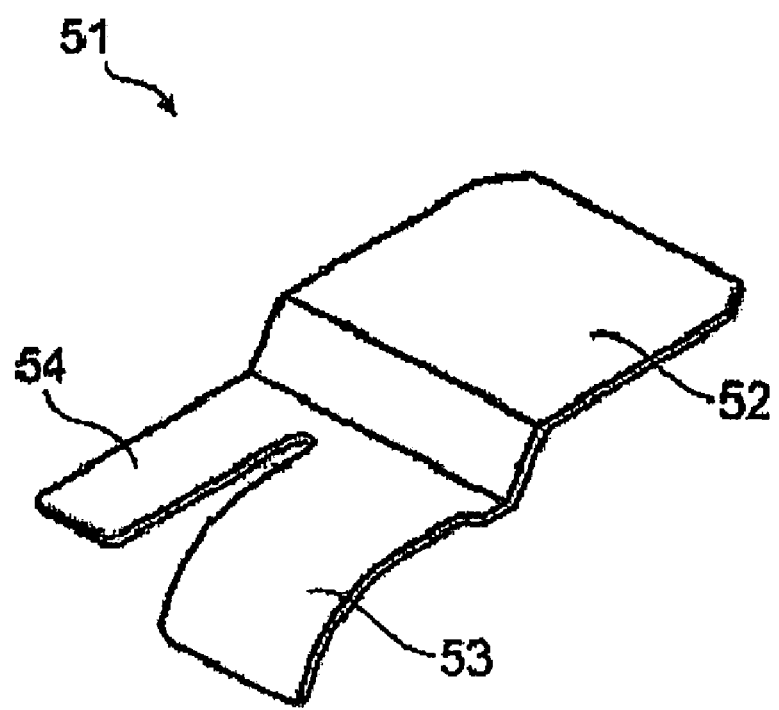
FIG. 15 is a perspective view of the EMI sheet.
Figure 16:
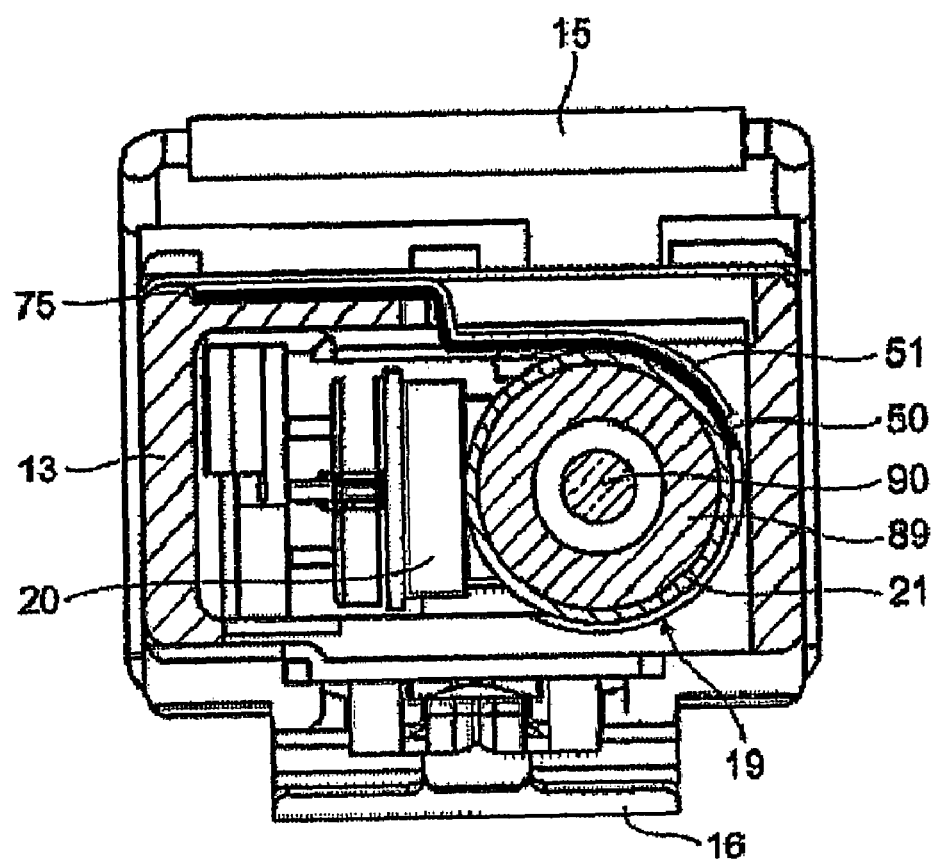
FIG. 16 is a cross sectional view taken along the line XVI-XVI in FIG. 3.

After setting the BOSA 11, the circuit board 12 and the holder 25, which are already described, are assembled with the housing 13, the thermal sheet 50 and the EMI sheet are set within the housing 13. FIG. 14 illustrates the process for setting two sheets in the housing 13. FIG. 15 is a perspective view of the EMI sheet 51, while FIG. 16 shows a cross section taken along the line XVI-XVI appeared in FIG. 3, which shows the thermal sheet 50 and the EMI sheet after setting in the housing 13.

As shown in FIG. 14, the thermal sheet 50 has a rectangular shape with a square cutting in one corner thereof. A portion 50a with a relatively narrower width is to be set in a depression 75 formed in the top 13a of the housing 13.

The EMI sheet 51 reduces the EMI noise by shielding the transceiver 10. As shown in FIG. 15, the EMI sheet 51 includes a base portion 52, an arched portion 53 and a finger 54. The latter two portions, 53 and 54, are formed with a step to the base portion 52, namely, in the downside of the base portion 52. The depression 75 of the housing 13 receives the base portion 52 stacked with the end 50a of the thermal sheet 50. One end of the base portion 52 is bent downward, namely, forms the step and continues to the arched portion 53 and the finger 54. The arched portion 53 has a shape fitted to the outer shape of the body 21, while the finger 54 is a metal plate with a rectangular shape. The arched portion 53 and the finger 54 extend in parallel from the base portion 52.

As shown in FIG. 14, the BOAS 11 stacks the thermal sheet 50 and the EMI sheet 51 on the thermal sheet 50. Because of the flexibility, the thermal sheet 50 may optionally bend so as to follow the outer shape of the EMI sheet 51 to adhesively come in contact with the outer peripheral of the body 21 and the side of the stem 23. As FIG. 16 illustrates, the height of the step between the base portion 52 and the arched portion 53 or the finger 54 corresponds to a difference between the bottom of the depression 75 and the top of the body 21 of the BOSA 11.

As shown in FIGS. 14 and 16, setting the base portion 52 of the EMI sheet 51 in the depression 75, the arched portion 53 covers and follows the outer surface of the body 21, while the finger 54 covers the side of the stem 23 and that of the rigid substrate 37. Thus, the arrangement described above may effectively shield the EMI noise and suppress the influence of the EMI noise to the ROSA 20.

The thermal sheet 50, which is put between the EMI sheet 51 and the BOSA 11, comes in contact with the body 21 of the BOSA 11 and the stem 23 of the TOSA 19. The thermal sheet is made of a material with a good thermal conductivity, for instance, silicone resin doped with heat conductive particles. The thermal sheet 50, put between the EMI sheet 51 and the BOAS 11 and by adhesively contact with the BOAS 11, may effectively conduct heat generated within the TOSA 19 to the EMI sheet 51 or to the housing 13.

The thermal sheet 50, stacked with the EMI sheet 51, is set within the depression 75 of the housing 13. Total thickness of both sheets is set slightly greater than the depth of the depression 75. Thus, setting both sheets, 50 and 51, in the depression 75 and setting the cover 14 to the housing 13, the cover 14 presses both sheets, 50 and 51, to make the cover adhesively in contact with the thermal sheet 50, which also enhances the heat dissipating effect.

Next will describe a process for assembling the optical transceiver 10 with the BOSA 11 having the configuration explained above.

FIGS. from 17 to 23 describe the process to assemble the transceiver 10 in a practical order. First, the bracket 43 is set in the stem 23 of the TOSA 19, and the shorter tabs 47, which abut in the platform thereof against the stem 23, are soldered with the stem 23, as shown in FIG. 11. Subsequently, passing the lead pins 24 of the TOSA 19 and the ROSA 20 through the via holes 39 in the rigid substrates, 37 and 38, provided in the end of the FPC substrates, 33 and 34, which extend from the edge of the circuit board 12, and the soldering between the lead pins 24 and the via holds 39 is carried out. The setup of the TOSA 19 with the body 21, and that of the ROSA 20 with the body 21 are preformed in advance of the soldering of the lead pins 24. However, the position of the lead pin 24 with respect to the body 21, that is, the rotation angle of the stem 23 with respect to the body 21 is necessary to be determined taking the optical coupling between the optical fiber in the sleeve shell 18 and the optical semiconductor device mounted on the stem 23. Accordingly, the angle of the stem 23, namely, the relative position of the lead pin 24 to the body 21 is not uniquely fixed.

The present transceiver 10 absorbs the variation in the position of the lead pin 24 by the FPC boards, 33 and 34. Further, the TOSA 19 attaches the bracket 43 with the stopper tab 48 that comes in contact with the rigid substrate 37 such that the stress to be applied to the FPC board 33 due to the positional variation of the lead pin 24 does not directly affect the lead pin 24. For the ROSA 20, the stress to be applied to the FPC boards 34 may be absorbed therein because the FPC board 34 for the ROSA 20 is relatively longer compared to that for the TOSA 19, besides, the FPC board 34 is bent on a way to the ROSA 20. In the present step, the finger 45 of the bracket 43 is not soldered with the circuit board 12 yet.

Figure 17:
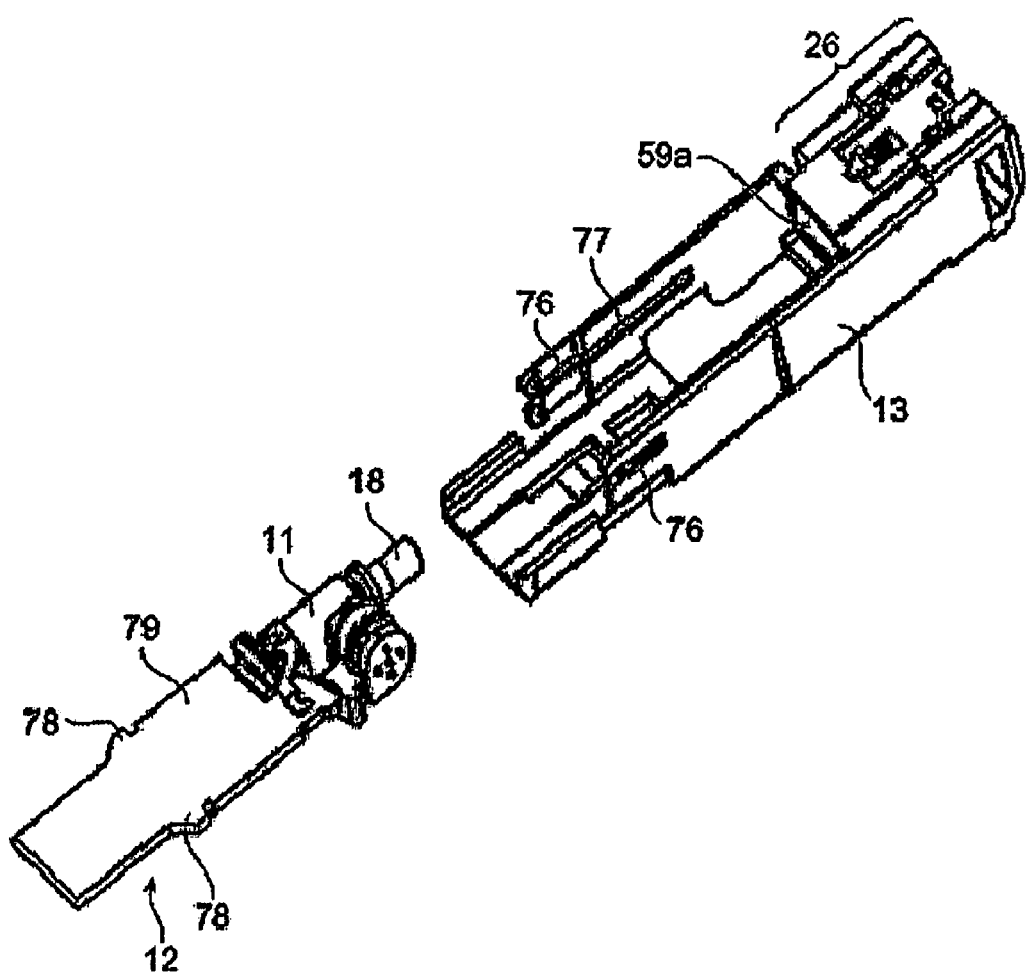
FIG. 17 shows a process to build the assembly of the bi-directional optical sub-assembly connected with the circuit board by the flexible printed circuit board within the housing.

Thus assembled BOSA 11 and the circuit board 12 are set within the housing 13, as shown in FIG. 17. The sleeve shell 18 of the BOSA 11 is inserted into the opening 58a in the partition 27 from the rear. The side of the housing 13 provides a notch 76 that extends forward from the rear end thereof and the inner surface of the side wall forms a groove 77 continuing from the notch 76. The circuit board 12 forms a projection 78 in a center of the side thereof. A front portion from the projection is formed wider compared to the rear portion thereof. Inserting the circuit board 12 with the BOSA 11 from the rear so as to set the front portion 79 with a wider width in the groove 77 in the inner surface of the side wall, the front edge of the projection 78 abuts against the deep end of the notch 76 to fix the circuit board 12. Thus, the circuit board is assembled with the housing 13.

Figure 18:
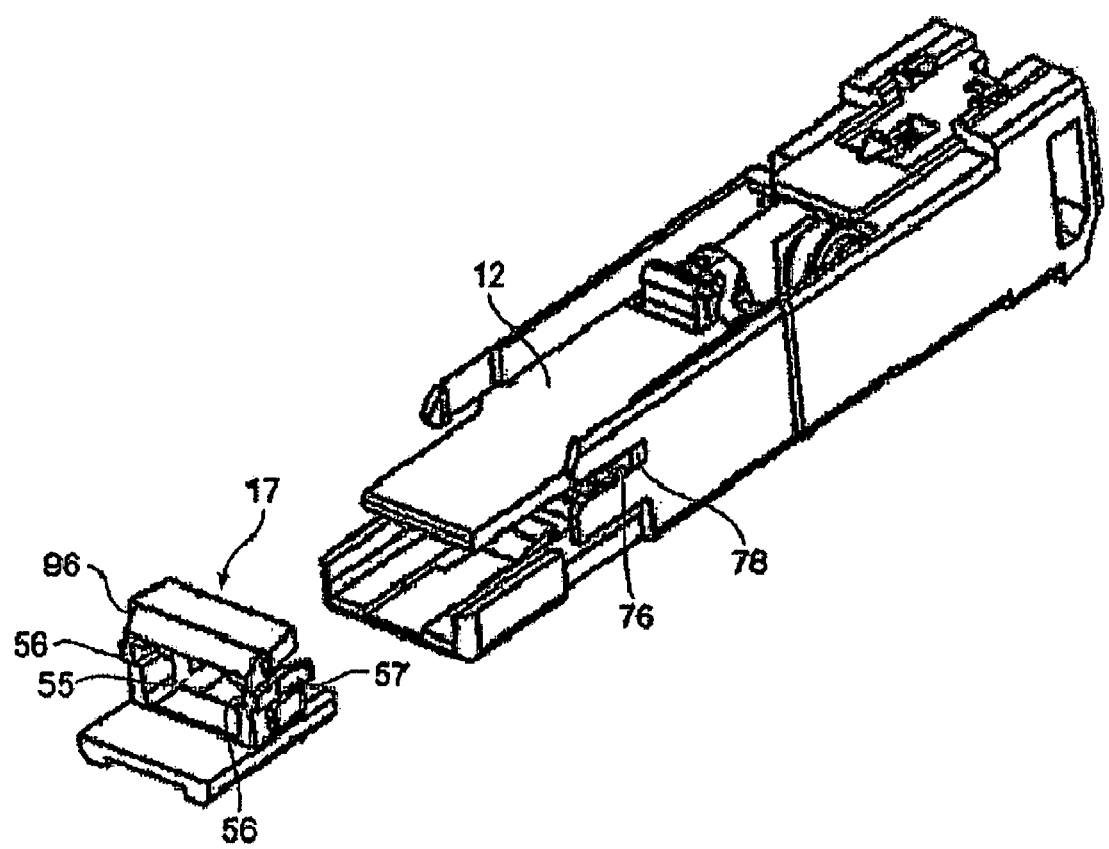
FIG. 18 shows a process to set the sub-holder in an end of the circuit board to fix the circuit board in the housing.

Subsequently, as shown in FIG. 18, the sub-holder 17 is fitted with the circuit board 12 from the rear. The sub-holder 17, made of resin, provides an opening 55 to receiver the rear end of the circuit board 12, and has a pair of grooves 56, which fits with the side of the circuit board 12, in both side surfaces that constitute the opening 55 and face to each other. The outer surface of the side forms a latch tab 57 whose shape follows the side of the rear portion of the circuit board 12. Above the opening 55 is provided with a lathing mechanism 96. Although FIG. 18 illustrates this mechanism above the opening 55, it is formed bottom side in the practical use of the transceiver 10.

Inserting the sub-holder 17 in to the housing 13 until the latch tab 57 comes in contact with the projection 78 as the side of the circuit board 12 fits in the groove 56 in the side of the opening 55, the latch mechanism 96 pushes outward the side walls of the housing 13 that provides the notch 76. Because the inner surface of the side walls provides the depression, the latch mechanism 96 of the sub-holder 17 mates with this depression to fix the circuit board 12 with the housing 13. Consequently, the forward slip of the circuit board 12, namely, to a side where the optical receptacle is formed, may be prevented by abutting the projection 78 of the circuit board 12 against the deep end of the notch 76, while the rear slip of the circuit board 12 may be prevented by abutting the rear side of the projection 78 against the latch tab 57 in the sub-holder 17 and by setting the latch mechanism 90 of the sub-holder 17 in the depression of the housing 13. Moreover, the up and down slipping of the circuit board 12 may be prevented by setting the sides of the board 12 into the inner groove 77 of the housing 13.

Figure 19:
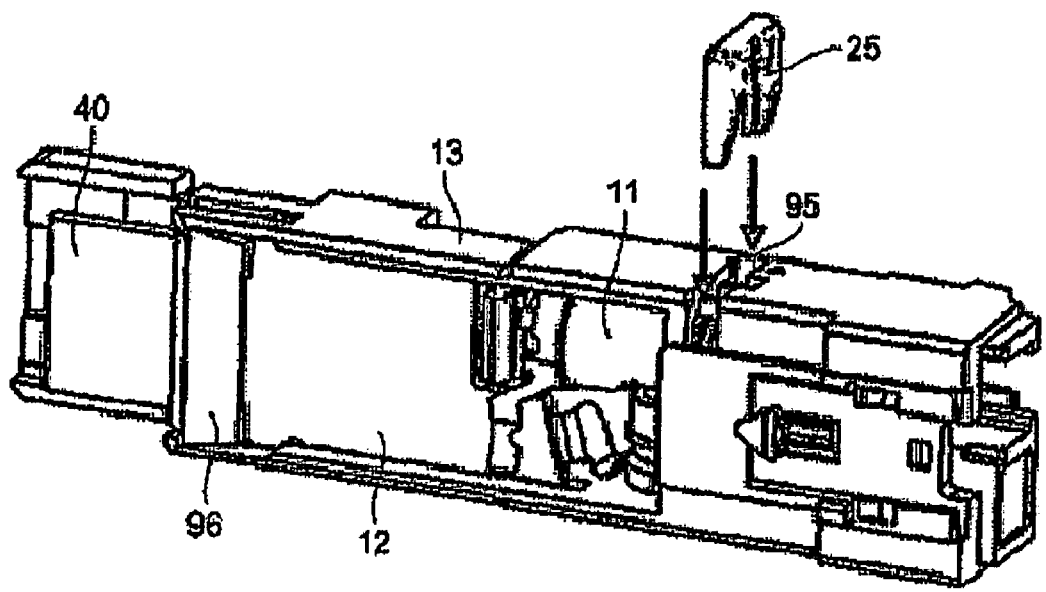
FIG. 19 shows a process to set the holder in the housing from the side wall thereof to fix the bi-directional optical sub-assembly to the housing.

After fixing the circuit board 12 assembled with the BOSA 11 in the housing 13, the holder 25 is attached to the BOSA 11, as illustrated in FIG. 19. The side of the housing 13 provides a slit 95 into which the holder 25 is inserted. Inserting the legs, 28 to 30, of the holder 25 into the pockets, 68 to 70, which are continuous to the slit 95 until the roots of the legs, 28 to 30, get into the slit, the legs, 28 to 30, fit with the flange 22 of the sleeve shell 18 and put the flange 22 between the upper and lower legs, 28 an 29. Further, the BOSA 11 may be positioned in the housing 13 by crashing the top of the rib 31 formed in the holder 25.

Figure 20:
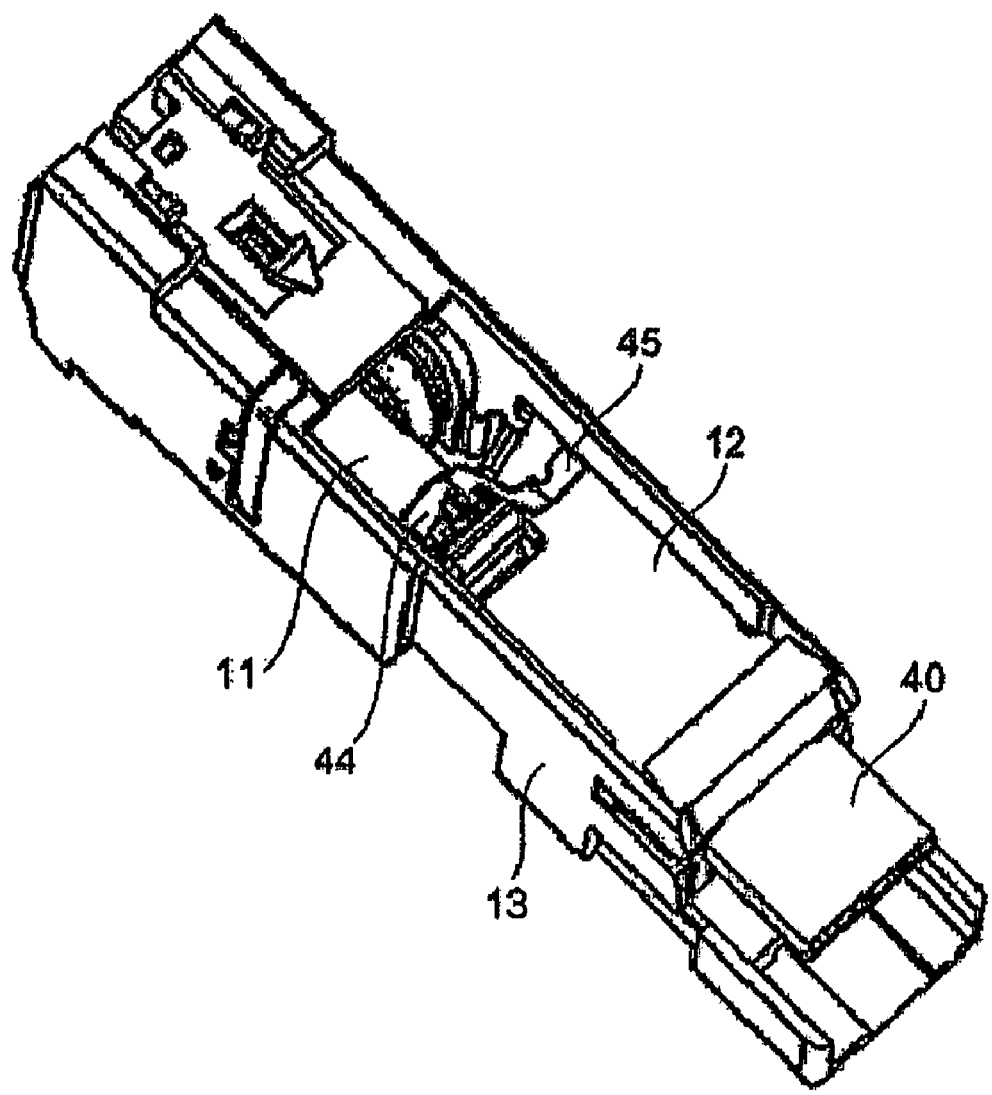
FIG. 20 shows a process to solder the finger portion of the bracket to the circuit board.

After positioning the BOSA 11 with respect to the housing 13, the finger portion 45 of the bracket 43 is soldered on the circuit board 12, as illustrated in FIG. 20. Because the bottom of the housing 13 widely exposed the BOSA 11, the soldering of the finger portion 45 may be easily performed. In the present embodiment, the soldering of the finger portion 45 is carried out after the fixing of the holder 25 to the housing 13. However, the soldering may be carried out before the fixing. That is, it is applicable to solder the bracket 43 with the circuit board 12 prior to the setting of the holder 25. The steps to attach the holder 25 and to solder the finger portion 45 with the circuit board 12 are optional sequences as far as these steps are carried out after the positioning of the circuit board 12 with the housing 13 and prior to set the metal cover 14.

Figure 21:
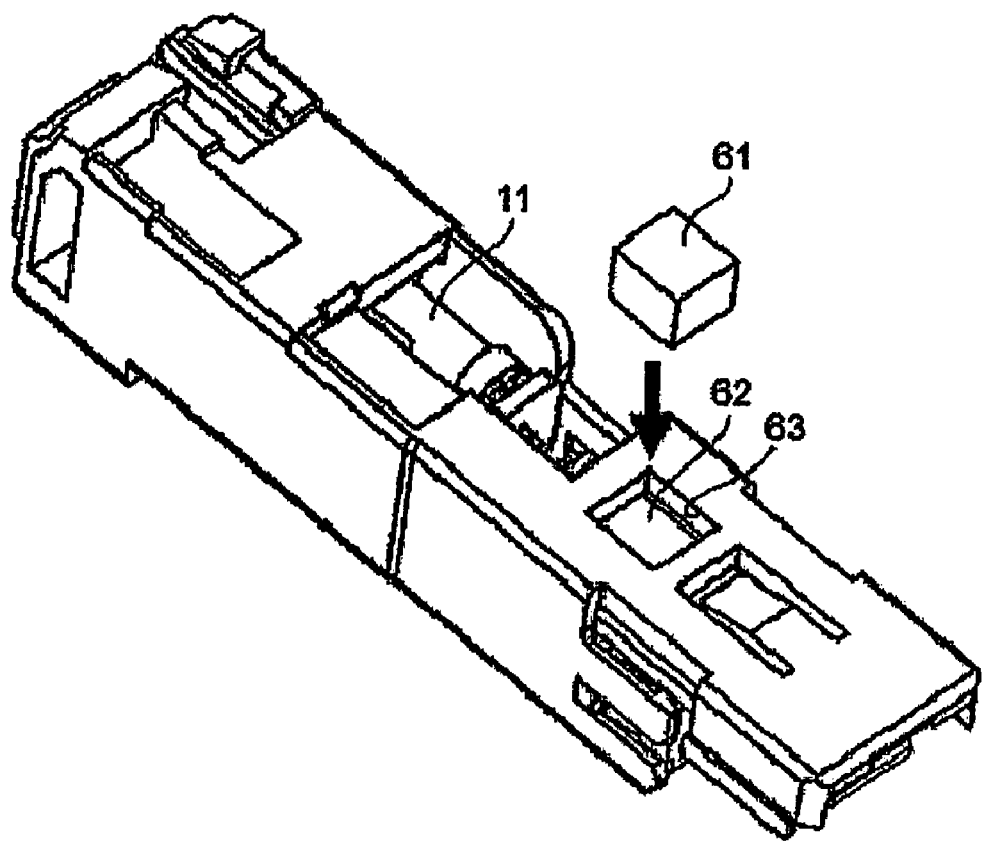
FIG. 21 shows a process to set the thermal block within the opening to come in contact with the top surface of the IC mounted on the circuit board.

Subsequently, the thermal block 61 is set within the opening 63 of the housing 13 so as to come in contact with the IC 73 mounted on the circuit board 12 as shown in FIG. 21. The thermal block 61 may be made of metal or resin. For the metal block, it is preferable to put a thin thermal sheet between the block 61 and the IC 73 or between the block 61 and the metal cover 14, which enables to absorb a mechanical stress caused by the contact to the metal cover 14.

In addition to the setting of the block 61, the thermal sheet 50 stacked with the EMI sheet 51 are set within the depression 75 so as to cover the body 21 of the BOSA 11 and the stem 23 of the TOSA 19.

Figure 22:
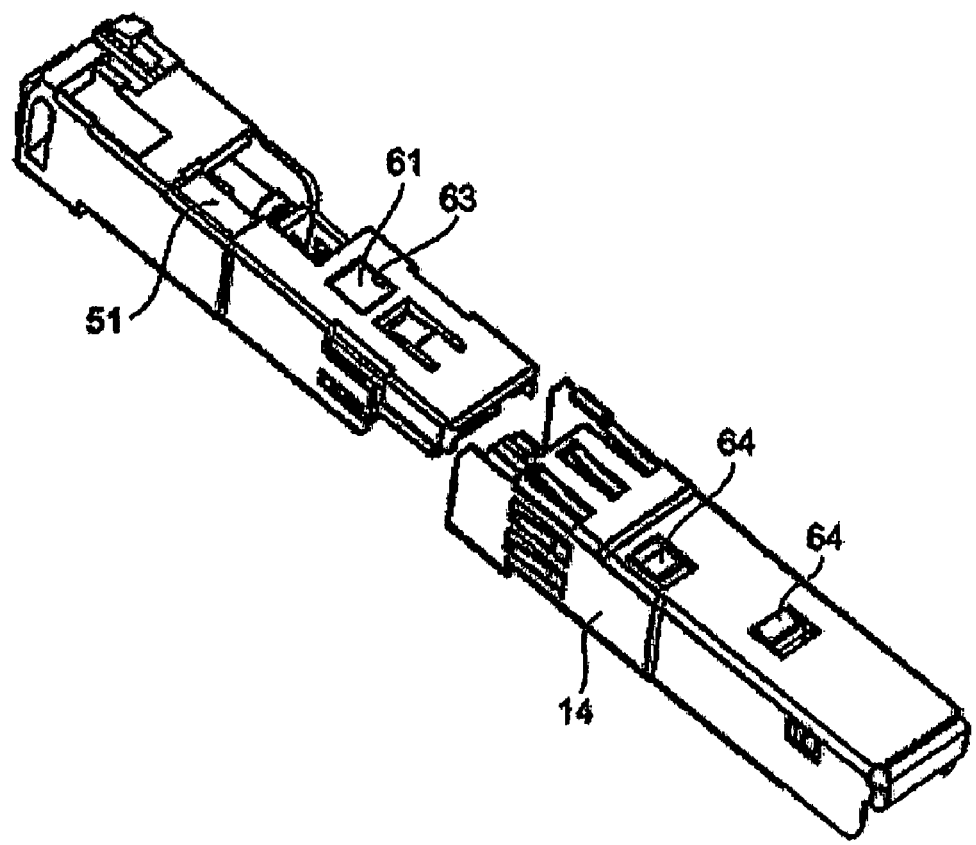
FIG. 22 shows a process to wrap the housing with the cover.

Subsequently, as shown in FIG. 22, the metal cover 14 is slid from the rear of the housing 13 so as to wrap the housing 13. The metal cover 14 is made of a metal sheet formed only by cutting and bending. No welding or gluing is carried out. The metal cover 14 provides an elastic tab in portions from which the EMI sheet exposed, portions facing the depression 75 and portions corresponding to the openings for the thermal block 61 and for the thermal sheet 62. These elastic tabs 64 are formed by making a slit with a U-shape and bending inward the tab surrounded by the U-shaped slit. These tabs 64 makes the thermal contact between the BOAS 11, the IC 73 or the housing 13 and the EMI sheet 51, the thermal block 61 or the thermal sheet 62 by pressing these sheets, 51 and 62, and the block 61.

Figure 23:
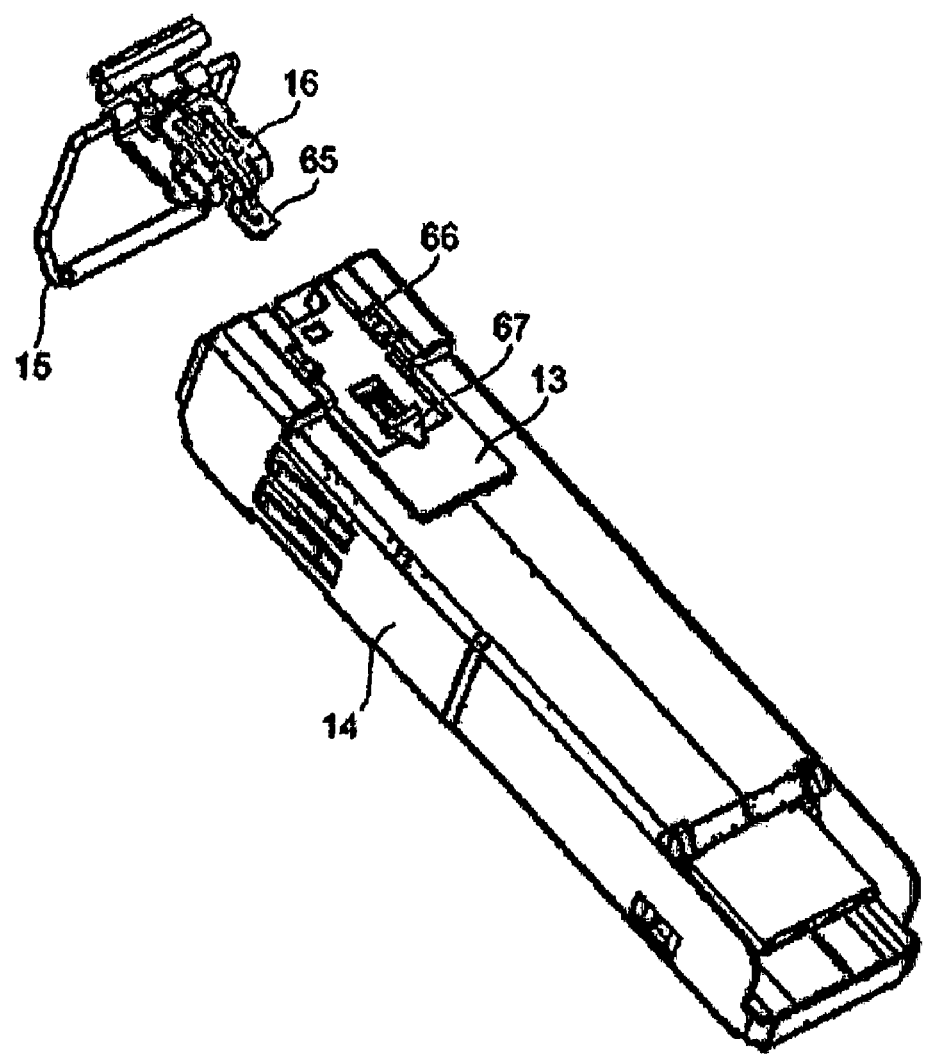
FIG. 23 shows a process to set the bail and the actuator in the bottom of the receptacle exposing from the cover.

Finally, the front of the housing 13 installs the bail 15 and the actuator 16, FIG. 23. The actuator 16 is a member with a U-shaped cross section formed by bending a metal sheet, and a lifting tab 65 protrudes from the bent portion. The bottom of the receptacle 26 provides a latch mechanism 66, which receives a pair of fingers of the actuator 16, where the fingers facing to each other by putting the lifting tab. Inserting the optical transceiver of the present embodiment into the cage of the host system, a latch projection 67 with a triangular shape, which is formed in the bottom of the receptacle 26, mates with the keyhole formed in the latch tab in a bottom center of the cage, which fixes the transceiver 10 to the cage and prevents the transceiver 10 from being slipped out from the cage. To pull the bail 15 forward may release the engagement of the transceiver 10 with the cage by pushing the lifting tab downward. Since the lifting tab 65 abuts against the latch tab of the base, to pull the bail 15 frontward pushes the latch tab of the cage downward to release the engagement of the lathing projection 67 of the transceiver 10 with the latch tab, which enables the transceiver 10 to be extracted from the cage.

The transceiver 10 may complete by labeling a sheet 81 on the top of the cover 14 or, if necessary, the side thereof, as shown in FIG. 1.

Although the present invention has been described with respect to certain specific embodiments, it will be apparent to those skilled in the art that the inventive features of the present invention are applicable to other embodiments, all of which are intended to fall within the scope of the present invention.

What is claimed is:

1. An optical transceiver, comprising:
    a circuit board that installs an electronic circuit; and
    a bi-directional optical subassembly including a first optical subassembly having a first optical axis and a second optical subassembly having a second optical axis substantially in perpendicular to the first optical axis, the second optical subassembly being electrically connected with the electronic circuit on the circuit board with a flexible printed circuit board,
    wherein the circuit board has a front edge with an obtuse angle with respect to the first optical axis, and
    wherein the flexible printed circuit board is configured to extend from the front edge of the circuit board to a direction substantially in parallel to the first optical axis, to be bent to a direction substantially in perpendicular to the circuit board to form a vertical portion, the vertical portion making the obtuse angle with respect to the first optical axis, to extend from a side of the vertical portion to form a connecting portion, and in the connecting portion, to be bent in a U-shaped cross section such that an end of the connecting portion is substantially in perpendicular to the second optical axis and substantially in parallel to the first optical axis.

2. The optical transceiver according to claim 1,
wherein the end of the connecting portion provides a rigid substrate with a plurality of via holes each receiving a corresponding lead pin extending from the second optical subassembly.

3. The optical transceiver according to claim 2,
wherein the vertical portion of the flexible printed circuit board makes an obtuse angle with respect to a primary surface of the rigid substrate.

4. The optical transceiver according to claim 1,
wherein the circuit board provides an extension extending along the first optical axis, and
wherein front edge of the circuit board is provided in an end of the extension.

5. The optical transceiver according to claim 1,
wherein the flexible printed circuit board includes a wiring layer and the circuit board stacks a wiring layer and a cover layer,
wherein the wiring layer in the circuit board continues to the wiring layer in the flexible printed circuit board.

6. The optical transceiver according to claim 5,
wherein the flexible printed circuit board provides a rigid substrate in an end of the connecting portion, the rigid substrate including a wiring layer and a cover layer, and
wherein the wiring layer of the flexible printed circuit board continues to the wiring layer of the rigid substrate.

7. The optical transceiver according to claim 5,
wherein the wiring layer in the flexible printed circuit board includes a wiring pattern with characteristic impedance matched with the electronic circuit on the circuit board.

8. The optical transceiver according to claim 1,
wherein the first optical subassembly is a transmitter optical subassembly and the second optical subassembly is a receiver optical subassembly.

9. An optical transceiver, comprising:
a circuit board that installs an electronic circuit; and
a bi-directional optical subassembly including a first optical subassembly having a first optical axis and a second optical subassembly having a second optical axis substantially in perpendicular to the first optical axis, the second optical subassembly being electrically connected with the electronic circuit on the circuit board with a flexible printed circuit board,
wherein the circuit board provides an extension extending along the first optical axis to a side of the second optical subassembly, and
wherein the flexible printed circuit board is configured to extend from a front side edge of the extension to a direction substantially in parallel to the second optical axis, and to be bent to a direction substantially in perpendicular to a primary surface of the circuit board to form a connecting portion.

10. The optical transceiver according to claim 9,
wherein an end of the connecting portion provides a rigid substrate with a plurality of via holes each receives a corresponding lead pin extending from the second optical subassembly.

* * * * *